(12) United States Patent
Greenberg et al.

(10) Patent No.: US 7,872,542 B2
(45) Date of Patent: Jan. 18, 2011

(54) VARIABLE CAPACITANCE WITH DELAY LOCK LOOP

(75) Inventors: Jody Greenberg, Sunnyvale, CA (US); Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 135 days.

(21) Appl. No.: 12/180,853

(22) Filed: Jul. 28, 2008

(65) Prior Publication Data

US 2008/0297218 A1 Dec. 4, 2008

Related U.S. Application Data

(63) Continuation-in-part of application No. 12/114,479, filed on May 2, 2008.

(60) Provisional application No. 61/024,711, filed on Jan. 30, 2008.

(51) Int. Cl.
*H03B 1/00* (2006.01)
*H03K 7/08* (2006.01)

(52) U.S. Cl. .................. 331/177 V; 332/109; 331/158; 331/176

(58) Field of Classification Search ............. 331/177 V, 331/36 C, 175, 176, 158, 116 R, 116 FE, 331/44, 57; 332/109, 110
See application file for complete search history.

(56) References Cited

U.S. PATENT DOCUMENTS

| | | | |
|---|---|---|---|
| 4,228,713 A | 10/1980 | Gross | |
| 4,893,097 A | 1/1990 | Zwack | |
| 5,053,723 A | 10/1991 | Schemmel | |
| 5,081,431 A | 1/1992 | Kubo et al. | |
| 5,574,408 A | 11/1996 | Zwack | |
| 5,659,270 A | 8/1997 | Millen et al. | |
| 5,748,045 A * | 5/1998 | Tateishi | 331/17 |
| 5,809,336 A | 9/1998 | Moore et al. | |
| 6,160,458 A | 12/2000 | Cole et al. | |
| 6,462,688 B1 | 10/2002 | Sutardja | |
| 6,598,148 B1 | 7/2003 | Moore et al. | |
| 6,803,829 B2 | 10/2004 | Duncan et al. | |
| 6,844,837 B1 | 1/2005 | Sutardja et al. | |
| 6,850,125 B2 | 2/2005 | Norman et al. | |

(Continued)

FOREIGN PATENT DOCUMENTS

EP  0 766 376 A1  4/1997

(Continued)

OTHER PUBLICATIONS

Notification of Transmittal of the International Search Report and The Written Opinion of The International Searching Authority, or the Declaration dated Mar. 6, 2009 in reference to PCT/US2008/084855.

(Continued)

*Primary Examiner*—Robert Pascal
*Assistant Examiner*—Ryan Johnson

(57) ABSTRACT

An integrated circuit includes a delay lock loop (DLL) circuit that generates incremental delay line signals and a delay line output signal based on a received clock signal. A pulse-width modulation (PWM) control module generates a PWM control signal. A tunable circuit having variable capacitance is controlled based on the delay line output signal, the PWM control signal, and one of the incremental delay line signals.

40 Claims, 19 Drawing Sheets

U.S. PATENT DOCUMENTS

| | | | |
|---|---|---|---|
| 6,998,928 B2 * | 2/2006 | Stengel et al. | 332/109 |
| 7,020,794 B2 | 3/2006 | Lin | |
| 7,046,042 B1 | 5/2006 | Dino et al. | |
| 7,095,348 B1 | 8/2006 | Sutardja et al. | |
| 7,114,069 B2 | 9/2006 | Tomerlin et al. | |
| 7,375,597 B2 | 5/2008 | Greenberg et al. | |
| 2003/0231039 A1 | 12/2003 | Locke | |
| 2004/0071029 A1 | 4/2004 | Sutardja | |

FOREIGN PATENT DOCUMENTS

| | | |
|---|---|---|
| EP | 1 119 106 | 7/2001 |
| EP | 1143606 A1 | 10/2001 |
| EP | 1 411 630 A1 | 4/2004 |
| WO | WO 2003/050637 | 6/2003 |
| WO | WO 2005/011118 A | 2/2005 |

OTHER PUBLICATIONS

U.S. Appl. No. 12/114,479, filed May 2008, Greenberg et al.

A Semidigital Dual Delay-Locked Loop; Stefanos Sidiropoulos, Student Member, IEEE, and Mark A. Horowitz, Senior Member, IEEE; IEEE Journal of Solid-State Circuits, vol. 32, No. 11, Nov. 1997; pp. 1683-1692.

* cited by examiner

VARIABLE CAPACITANCE WITH DELAY LOCK LOOP

CROSS-REFERENCE TO RELATED APPLICATIONS

This application claims the benefit of U.S. Provisional Application No. 61/024,711, filed Jan. 30, 2008, and is a continuation-in-part of U.S. patent application Ser. No. 12/114,479 filed on May 2, 2008, which is a continuation of U.S. patent application Ser. No. 11/242,230 filed on Oct. 3, 2005, which claims the benefit of U.S. Provisional Application No. 60/704,280, filed on Aug. 1, 2005, and 60/722,732, filed on Sep. 30, 2005. The disclosures of the above applications are incorporated herein by reference in their entirety.

FIELD

The present disclosure relates generally to electronic circuit tuning, and more particularly to pulse-width modulating capacitors to achieve low-noise, fine-frequency tuning.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Frequency responses of electronic circuits are tuned in various applications, such as wired or wireless switches, controllers, transceivers, filters, power management units, data storage units, etc. Current techniques used to tune a frequency response have limited resolution and limited noise minimization control.

In addition, some tuning circuits tend to require additional terminals and system board space. For example, tuning circuits with crystal oscillators are used for high accuracy and low temperature drift tuning applications. A crystal oscillator, when used as a separate stand-alone device, is coupled to one or more pins of an integrated circuit and consumes system board space.

To save system board space, varactor diodes may be used and included in an integrated circuit. However, when capacitance of a varactor diode is tuned, such as by applying an analog control voltage in an open loop manner, noise problems result. Although current of the integrated circuit can be increased in order to reduce the noise, increased current results in increased power consumption. Increased power consumption decreases the working life of battery powered electronic systems.

Digitally adjusted capacitors, such as capacitors that are connected or disconnected using a switch, can be used to reduce noise in a tuning circuit. Digitally adjusted capacitors are typically either equally or binarily weighted. When equally weighted, a large number of capacitors and corresponding switches provide tuning with a large tuning range and a fine resolution. Where binarily weighted, capacitors with small capacitance values are limited in size by parasitic capacitances of the switches. Capacitors with large capacitance values are limited by available die area.

SUMMARY

In one embodiment, an integrated circuit is provided and includes a delay lock loop (DLL) circuit. The DLL circuit generates incremental delay line signals and a delay line output signal based on a received clock signal. A pulse-width modulation (PWM) control module generates a PWM control signal. A tunable circuit having variable capacitance is controlled based on the delay line output signal, the PWM control signal, and one of the incremental delay line signals.

In other features, the tunable circuit includes a capacitance and a switch that enables current flow to the capacitance based on the delay line output signal, the PWM control signal, and one of the incremental delay line signals.

In other features, the integrated circuit includes a multiplexer that generates a selected delay line signal based on the PWM control signal and one of the incremental delay line signals. In other features, the tunable circuit is controlled based on the selected delay line signal and the delay line output signal.

In other features, the integrated circuit includes a latch that enables current flow to the tunable circuit based on the delay line output signal, the PWM control signal, and one of the incremental delay line signals.

In still other features, the integrated circuit includes a latch that controls charging of the tunable circuit based on the delay line output signal, the PWM control signal, and one of the incremental delay line signals.

In other features, the integrated circuit includes a multiplexer that generates a selected delay line signal based on the PWM control signal and one of the incremental delay line signals. A latch generates an adjustment signal based on the selected delay line signal and the delay line output signal. A switch enables current flow to the tunable circuit based on the adjustment signal.

In yet other features, the PWM control module generates the PWM control signal based on a condition signal. In other features, the condition signal is generated based on a measurement of one of an environment and a process.

In other features, the DLL circuit includes a phase detector that detects the difference in phase between the received clock signal and the delay line output signal. The delay line output signal is generated based on the phase difference. In other features, the DLL circuit includes a filter that generates a filtered difference signal based on the phase difference. The delay line output signal is generated based on the filtered difference signal.

In further features, the integrated circuit includes a calibration control module that generates a calibration control signal based on the received clock signal. The PWM control module generates the PWM control signal based on the calibration control signal. In other features, the calibration control module generates the calibration control signal based on a reference clock signal. In other features, the calibration control module generates the calibration control signal based on a temperature signal.

In still other features, the integrated circuit includes a calibration control module that generates a calibration control signal based on a temperature signal. The pulse-width modulation circuit generates the PWM control signal based on the calibration control signal.

In other features, the integrated circuit includes a divide-by-N module that divides the received clock signal to generate a divided clock signal, where N is an integer greater than 0. The DLL circuit generates the incremental delay line signals and the delay line output signal based on the divided clock signal.

In yet other features, the integrated circuit includes a divide-by-N module that divides the received clock signal to generate a divided clock signal, where N is an integer greater than 0. The PWM control module generates the PWM control signal based on the divided clock signal. In other features, the PWM control module generates the PWM control signal based on the divided clock signal and a received condition signal. In other features, the condition signal is generated based on a measurement of one of an environment and a process.

In further features, the PWM control module generates the PWM control signal based on entries in a lookup table. In other features, the PWM control module generates the PWM control signal based on temperature entries in the lookup table.

In other features, a method of operating an integrated circuit is provided and includes generating incremental delay line signals and a delay line output signal based on a received clock signal. A PWM control signal is generated. A tunable circuit having variable capacitance is controlled based on the delay line output signal, the PWM control signal, and one of the incremental delay line signals.

In other features, the method includes enabling current flow to a capacitance of the tunable circuit based on the delay line output signal, the PWM control signal, and one of the incremental delay line signals.

In still other features, the method includes generating a selected delay line signal based on the PWM control signal and one of the incremental delay line signals. In other features, the method includes controlling the tunable circuit based on the selected delay line signal and the delay line output signal.

In other features, the method includes enabling current flow to the tunable circuit based on the delay line output signal, the PWM control signal, and one of the incremental delay line signals.

In yet other features, the method includes charging the tunable circuit based on the delay line output signal, the PWM control signal, and one of the incremental delay line signals.

In other features, the method includes generating a selected delay line signal based on the PWM control signal and one of the incremental delay line signals. An adjustment signal is generated based on the selected delay line signal and the delay line output signal. Current flow is enabled to the tunable circuit based on the adjustment signal.

In other features, the method includes generating the PWM control signal based on a condition signal. In other features, the condition signal is generated based on a measurement of one of an environment and a process.

In further features, the method includes detecting difference in phase between the received clock signal and the delay line output signal. The delay line output signal is generated based on the phase difference.

In other features, the method includes generating a filtered difference signal based on the phase difference. The delay line output signal is generated based on the filtered difference signal.

In other features, the method includes generating a calibration control signal based on the received clock signal. The PWM control signal is generated based on the calibration control signal. In other features, the calibration control signal is generated based on a reference clock signal. In other features, the calibration control signal is generated based on a temperature signal.

In still other features, the method includes generating a calibration control signal based on a temperature signal. The PWM control signal is generated based on the calibration control signal.

In other features, the method includes dividing the received clock signal to generate a divided clock signal via a divide-by-N module, where N is an integer greater than 0. The incremental delay line signals and the delay line output signal are generated based on the divided clock signal.

In yet other features, the method includes dividing the received clock signal to generate a divided clock signal via a divide-by-N module, where N is an integer greater than 0. The PWM control signal is generated based on the divided clock signal.

In other features, the PWM control signal is generated based on the divided clock signal and a received condition signal. In other features, the condition signal is generated based on a measurement of one of an environment and a process. In other features, the PWM control signal is generated based on entries in a lookup table. In other features, the PWM control signal is generated based on temperature entries in the lookup table.

In further features, an integrated circuit is provided and includes DLL means for generating incremental delay line signals and a delay line output signal based on a received clock signal. Pulse-width modulation means generates a PWM control signal. Tunable means provides a variable capacitance that is controlled based on the delay line output signal, the PWM control signal, and one of the incremental delay line signals.

In other features, the tunable means includes capacitance means for providing a capacitance. Switching means enables current flow to the capacitance based on the delay line output signal, the PWM control signal, and one of the incremental delay line signals.

In still other features, the integrated circuit includes multiplexing means for generating a selected delay line signal based on the PWM control signal and one of the incremental delay line signals. In other features, the tunable means is controlled based on the selected delay line signal and the delay line output signal.

In other features, the integrated circuit includes latching means for enabling current flow to the tunable means based on the delay line output signal, the PWM control signal, and one of the incremental delay line signals.

In yet other features, the integrated circuit includes latching means for controlling charging of the tunable means based on the delay line output signal, the PWM control signal, and one of the incremental delay line signals.

In other features, the integrated circuit includes multiplexing means for generating a selected delay line signal based on the PWM control signal and one of the incremental delay line signals. Latching means generates an adjustment signal based on the selected delay line signal and the delay line output signal. Switching means enables current flow to the tunable means based on the adjustment signal.

In other features, the pulse-width modulation means generates the PWM control signal based on a condition signal. In other features, the condition signal is generated based on a measurement of one of an environment and a process.

In further features, the DLL means includes phase detection means for detecting the difference in phase between the received clock signal and the delay line output signal. The delay line output signal is generated based on the phase difference.

In other features, the DLL means includes filtering means for generating a filtered difference signal based on the phase difference. The delay line output signal is generated based on the filtered difference signal.

In other features, the integrated circuit includes calibration means for generating a calibration control signal based on the received clock signal. The pulse-width modulation means generates the PWM control signal based on the calibration control signal.

In other features, the calibration control means generates the calibration control signal based on a reference clock signal. In other features, the calibration control means generates the calibration control signal based on a temperature signal.

In still other features, the integrated circuit includes calibration means for generating a calibration control signal based on a temperature signal. The pulse-width modulation means generates the PWM control signal based on the calibration control signal.

In yet other features, the integrated circuit includes divide-by-N means for dividing the received clock signal to generate a divided clock signal, where N is an integer greater than 0. The DLL means generates the incremental delay line signals and the delay line output signal based on the divided clock signal.

In other features, the integrated circuit includes divide-by-N means for dividing the received clock signal to generate a divided clock signal, where N is an integer greater than 0. The pulse-width modulation means generates the PWM control signal based on the divided clock signal.

In other features, the pulse-width modulation means generates the PWM control signal based on the divided clock signal and a received condition signal. In other features, the condition signal is generated based on a measurement of one of an environment and a process.

In other features, the pulse-width modulation means generates the PWM control signal based on entries in a lookup table. In other features, the pulse-width modulation means generates the PWM control signal based on temperature entries in the lookup table.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
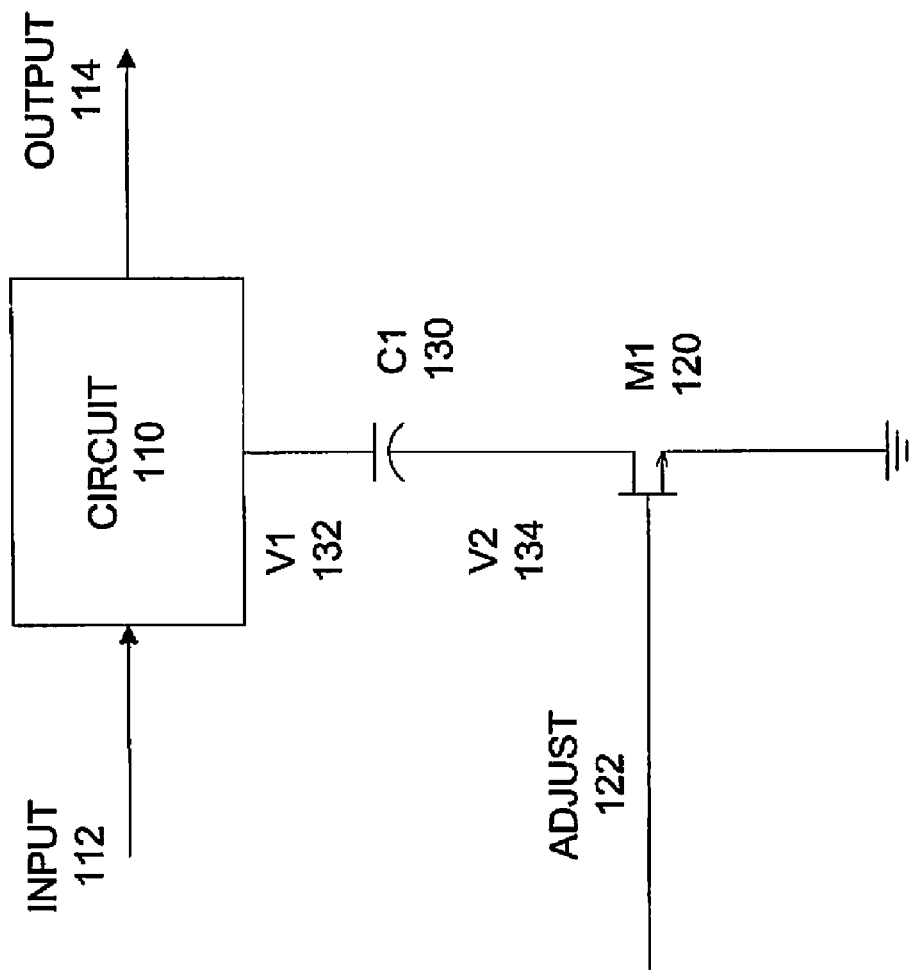
FIG. 1 is a schematic of a circuit having a frequency characteristic tuned by a pulse-width modulated capacitor according to an embodiment of the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Referring to FIG. 1 is a schematic of a circuit having a frequency response or characteristic tuned by a pulse-width modulated capacitor according to an embodiment of the present invention. This figure includes a circuit 110, and a tunable circuit including transistor M1 120 and a capacitor C1 130. The circuit 110 has a frequency response or characteristic that is at least partially determined by the effective capacitance value of the capacitor C1 130. The circuit 110, transistor 120, and capacitor 130 may be included on an integrated circuit. This figure, as with the other included figures, is shown for exemplary purposes and does not limit either the possible embodiments of the present invention or the claims.

The adjust signal on line 122 adjusts or controls the impedance of transistor M1 120. When the level of the adjust signal on line 122 is high, and transistor M1 120 is on and connects capacitor C1 130 to ground, in effect connecting capacitor C1 130 to the circuit 110. When the adjust signal on line 122 is low, the impedance of transistor M1 120 is high, allowing capacitor C1 130 to float, effectively disconnecting the capacitor C1 130 from the circuit 110. When this capacitor is connected to ground, it is at least partially responsible for determining a frequency characteristic of the circuit 110. Conversely, when the capacitor C1 130 is floating, it has a reduced effect on this frequency response or characteristic.

However, when the capacitor C1 130 is floating it is not completely removed or disconnected. Transistor M1 120 includes parasitic capacitances, notably the drain-to-gate capacitance and the capacitance of the drain-to-bulk diode, which remains in series with capacitor C1 130 when transistor M1 120 is off. These parasitic capacitances limit the minimum practical size of C1 130. This in turn limits the resolution with which the frequency characteristic of the circuit 110 can be tuned.

Accordingly, embodiments of the present invention adjust the size of capacitor C1 130 with a finer resolution by applying a switching signal having a variable duty cycle, specifically the adjust signal on line 122. By varying the duty cycle of the adjust signal on line 122, the capacitor C1 130 is connected to the circuit 110 part of the time, and disconnected from the circuit 110 for the remainder. In this way, a duty cycle adjustment can be used to vary the effective size of capacitor C1 130. That is, as the duty cycle increases and device M1 120 is on for a greater portion of time, the effective size of capacitor C1 130 is increased, while as the duty cycle is decreased, device M1 120 conducts or is on for a shorter portion and the effective size of C1 130 is thereby reduced.

Thus, a frequency response or characteristic of the circuit 110 can be adjusted by varying the duty cycle of the adjust signal on line 122. However, it should be noted that changes in the frequency of the adjust signal on line 122 by themselves do not have a first-order effect on the effective capacitance provided by the capacitor C1 130.

During operation when M1 120 is on, the voltage V2 on line 134 (the drain of M1 120) is near ground. When the adjust signal on line 122 switches low thereby shutting off M1 120, the voltage V2 on line 134 is allowed to float. Accordingly, the voltage V2 on line 134 tracks changes in the voltage V1 on line 132. Later, when the adjust signal on line 122 returns high and M1 120 conducts, the voltage V2 on line 134 is again forced to ground. If the voltage V2 on line 134 has floated from ground when device M1 120 turns on, charge is injected through C1 130 into the circuit 110. This charge injection should be accounted for in the design of the circuit 110 and the timing of the adjust signal on line 122. It should also be noted that the drain-to-bulk diode might turn on and clamp the voltage V2 on line 134 when the capacitor C1 130 is allowed to float, specifically when the voltage V2 on line 134 floats below ground. This clamping can be minimized by ensuring that the signal swing at V1 132 does not exceed a few hundred millivolts.

In a specific embodiment of the present invention, the circuit 110 is an oscillator that provides an oscillatory signal at a frequency that is determined at least in part by the effective value of the capacitor C1 130. In this embodiment, the adjust signal on line 122 is opened and closed at a frequency that is a sub-harmonic of the frequency of the oscillator. Accordingly, each time the transistor M1 120 closes or begins to conduct, the voltage V2 on line 134 is near ground, thus limiting the charge injection back into the oscillator.

In this exemplary figure, the circuit 110 receives an input signal on line 112 and provides an output on line 114. In various embodiments of the present invention, there is no input signal 112, for example where the circuit 110 is an oscillator as described above. The input and output signals may use single-ended or differential signaling techniques. Typically, lines in this and the other figures may be one line, or a group of lines, such as a bus.

The capacitor C1 130 may be in parallel or in series with one or more other capacitors that may or may not be connected to switches. The capacitor C1 130 may be a metal-sinker capacitor, a metal-to-metal capacitor, or other type of capacitor. It may be one capacitor, or a combination of more than one individual capacitor. The transistor M1 120 may be an n-channel MOS device as shown. Alternately it may be a p-channel MOS device, bipolar device, HFET, HBT, MESFET, or other type of transistor. In other embodiments of the present invention, the transistor M1 120 may be replaced by another type of switch such as a pass or tri-state gate. Also, in some embodiments the switch and the capacitor may be combined into a single composite structure. While these figures show a switch transistor coupled between a capacitor and ground, in various embodiments, the switch may be between the capacitor and the circuit, between the capacitor and another node, such as a bias voltage or a supply voltage, or the switch and capacitor may be take on other arrangements.

The circuit 110 may be an oscillator as previously described, a filter, or other circuit where a variable frequency response or characteristic is desired. One example of an oscillator incorporating an embodiment of the present invention is shown in the next figure.

Figure 2:
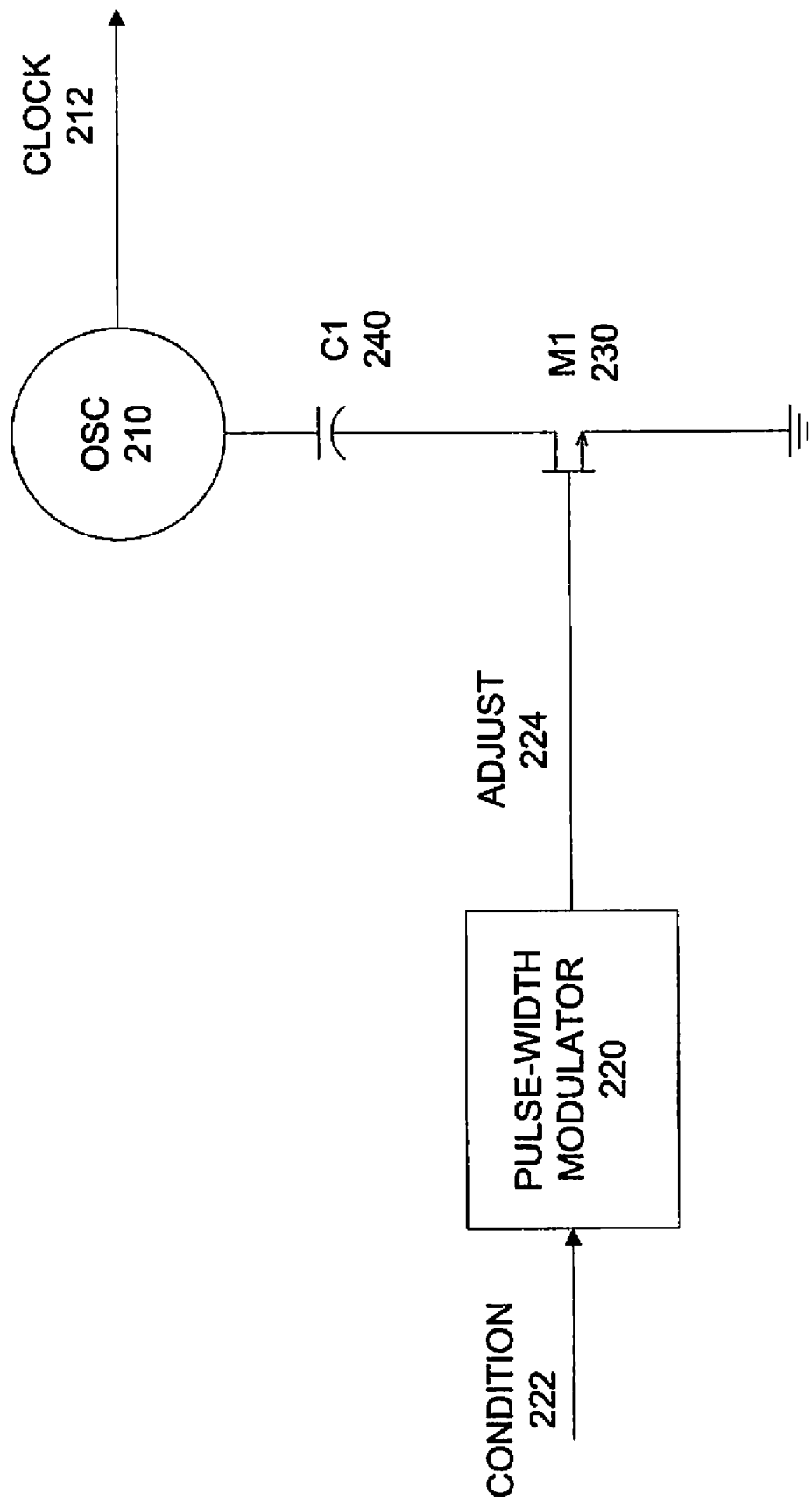
FIG. 2 is a block diagram of a free-running oscillation circuit according to an embodiment of the present disclosure.

FIG. 2 is a block diagram of a free-running oscillation circuit according to an embodiment of the present invention. This figure includes an oscillator 210, pulse-width modulator 220, transistor M1 230, and capacitor C1 240. The oscillator 210 generates a clock signal on line 212. The clock signal has a frequency that is determined at least partially by the effective capacitance value provided by the capacitor C1 240 and transistor M1 230.

A condition signal is received on line 222 by the pulse-width modulator 220. This condition signal may be either a current or a voltage that is provided or generated in response to an environmental, process, or other condition or combination thereof. For example, the condition signal on line 22 may be in response to a temperature, power supply voltage, or other environmental condition. Alternately, the condition signal on line 222 may be in response to a process variation occurring during the manufacture of an integrated circuit that includes one or more of the circuits in this figure. In other embodiments, the condition signal on line 222 may be a control setting, for example, a voltage provided by a potentiometer. The condition signal 222 may be proportional to the condition itself or it may have another relationship to the condition. For example, the condition signal may be a current or a voltage that is proportional to absolute temperature.

The pulse-width modulator 220 converts the condition signal on line 222 into the adjust signal on line 224. Specifically, the pulse-width modulation circuit 220 varies the duty cycle of the adjust signal on line 224 as a function of the condition signal received on line 222.

The transistor M1 230 turns on and off under control of the level of the adjust signal on line 224, thus alternately connecting and disconnecting the capacitor C1 240 from the oscillator 210. The longer capacitor C1 240 is connected to the oscillator 210, the greater the effective capacitance value of the capacitor C1 240. While only one capacitor C1 240 and corresponding transistor M1 230 are shown, practical circuits typically include several such capacitor-transistor combinations in parallel or in series with each other, the transistors (or other switches) under control of various adjust signals.

Again, in a specific embodiment of the present invention, the adjust signal on line 224 is a sub-harmonic of the clock frequency on line 212. In this embodiment, the clock signal on line 212 clocks the pulse width modulation circuit 220. In one embodiment, the nominal frequency of the oscillator 210 is 1.280 GHz. This frequency is divided by a factor of four to 320 MHz, which is further divided by 32, resulting in a fundamental frequency of 10 MHz for the adjust signal on line 224. The duty cycle of this 10 MHz signal is then varied and provided as the adjust signal on line 224.

The relationship between the condition signal on line 222 and the adjust signal on line 224 may be different in various embodiments of the present invention. That is, the pulse width modulation circuit 220 may be configured such that the frequency of the clock signal on line 212 tracks in the condition signal on line 222. Alternately, other relationships are possible. For example, the pulse width modulation circuit 220 may be configured to provide a frequency for the clock signal on line 212 that is stable over changes in the condition that is measured to generate the condition signal on line 222.

A specific embodiment of the present invention provides an oscillator having a clock signal with a frequency that is stable over temperature. In order to achieve this, the oscillator first undergoes a calibration process. Examples of such a calibration process are shown in the next two figures.

Figure 3:
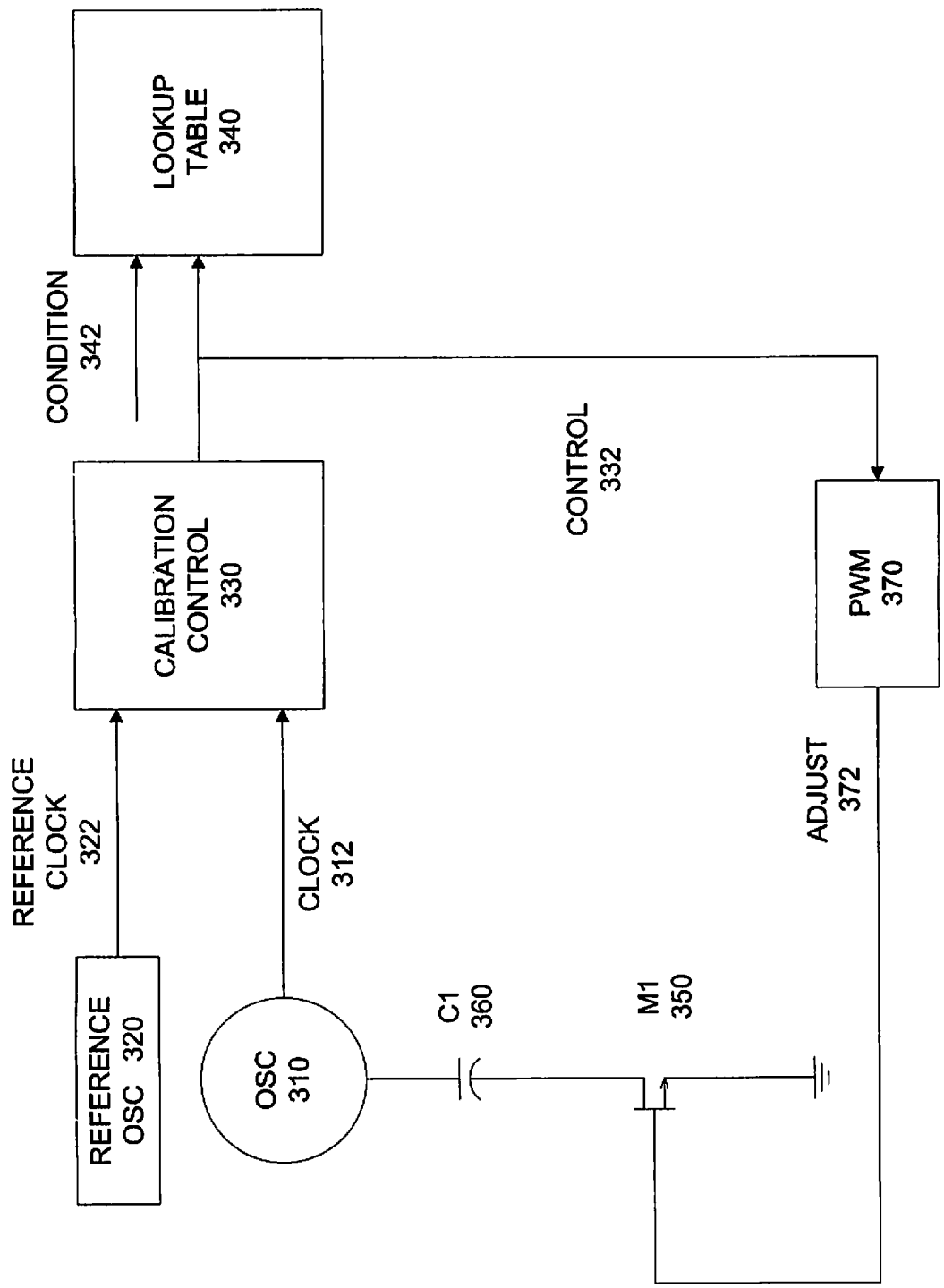
FIG. 3 is a block diagram illustrating the free-running oscillation circuit of FIG. 2 undergoing calibration.

FIG. 3 is a block diagram illustrating the free-running oscillation circuit of FIG. 2 while it is undergoing calibration. This figure includes an oscillator 310, reference oscillator 320, calibration control circuit 330, programmable lookup table 340, transistor M1 350, capacitor C1 360, and pulse width modulator circuit 370. The frequency of oscillation of the oscillator 310 is determined at least in part by the effective capacitance value provided by the capacitor C1 360. Typically, the oscillator 310, transistor M1 350, and capacitor C1 360 are included on an integrated circuit, while the reference oscillator 320 is separate. The calibration control circuit 330 and lookup table 340 may or may not be included on the integrated circuit depending on the exact implementation.

The reference oscillator 320 may be a crystal oscillator or other periodic source. Alternately, it may be such a source in conjunction with one or more frequency multipliers or dividers. The calibration control circuit 330 includes a frequency detector that compares the frequency of the reference clock signal on line 322 to the frequency of the clock signal on line 312. From this information, the calibration control circuit 330 provides a control signal on line 332.

The calibration control circuit 330 varies the value of the control signal on line 332 in a manner depending on the relative frequencies of these input signals. When the frequency of the clock signal on line 312 is tuned within an acceptable margin of error to the frequency of the reference clock signal on line 322, the control signal on line 332, or other data corresponding to the control signal on line 332, is stored in the lookup table 340 along with the condition measurement. This process may be repeated at several condition values or states, and for one or more different conditions.

Once a number of control signal values and their corresponding condition measurements are stored in the lookup table 340, the data can be read out and further processed, though in other embodiments of the present invention, data is processed when determined without first being stored in a lookup table 340. In one embodiment of the present invention, a best-fit curve is generated based on the data. In a specific embodiment, this curve is described by a second-order polynomial, though in other embodiments of the present invention it may be a different type of curve having a different order. Alternately, the curve may be predefined where the data used to shift the curve, not to define it. Other variations or combinations can also be used. After the data is fit to a curve, several more control signal data points can be interpolated between the measured data points.

A processor that is external to the integrated circuit can perform the curve fitting and interpolation. For example, a processor that is part of a test or manufacturing system can perform either or both of these functions. Alternately, an on-chip processor can do either or both of these functions, or they may be shared between on-chip and off-chip processors.

The interpolated control signal values (or data corresponding to control signal values) can be stored in a lookup table or other memory. The data can be addressed by the corresponding condition measurement value. This lookup table can be the same lookup table 340 as is used to store condition measurements and control signal values before curve fitting is done. Alternately, another lookup table can be used. The lookup table or other memory used to store interpolated data is typically on-chip; though in other embodiments it can be off-chip.

In a specific embodiment of the present invention, an on-chip heating circuit is used to vary the temperature of an integrated circuit that includes a circuit to be calibrated. This heating circuit dissipates a variable amount of power in order to adjust die temperature; die temperature being the measured condition. One such heating circuit can be found in copending U.S. patent application Ser. No. 11/243,017, titled "On-Die Heating Circuit and Control Loop for Rapid Heating of the Die," by Jody Greenberg and Sehat Sutardja, filed Sep. 3, 2005, which is incorporated by reference.

The control signal values required for the frequency of the oscillator 310 to match the frequency of the reference oscillator 320 are stored for a number of temperatures. The temperature can be measured, or the temperature can be inferred given a specific level of power dissipation in the heater circuit. Since each temperature measurement costs money, embodiments of the present invention typically limit the number of temperature data points taken. For example, in one embodiment, two temperature data points are taken. An expected curve is used, where the two data points are used to shift and adjust the curve. In another embodiment of the present invention, five data points are used, and a second-order polynomial curve is fit to the data. In other embodiments, other curve-fitting techniques and other number of data points can be used.

From this curve, a larger number of data points can be interpolated. For example, in the specific embodiment, temperature is converted from an analog PTAT voltage to an 8-bit address using an 8-bit analog-to-digital converter. Accordingly, 256 data points are interpolated and stored in a memory or lookup table that is addressed by the digital conversion of the temperature. In other embodiments, converters having other resolutions and memories having other numbers of addressable locations can be used.

In operation, the temperature is measured, converted to a digital signal, and used to address a control signal value. The control signal value is used to generate a pulse-width modulated adjust signal, which in turn varies a capacitor value that tunes the oscillator to the desired frequency.

Figure 4A:
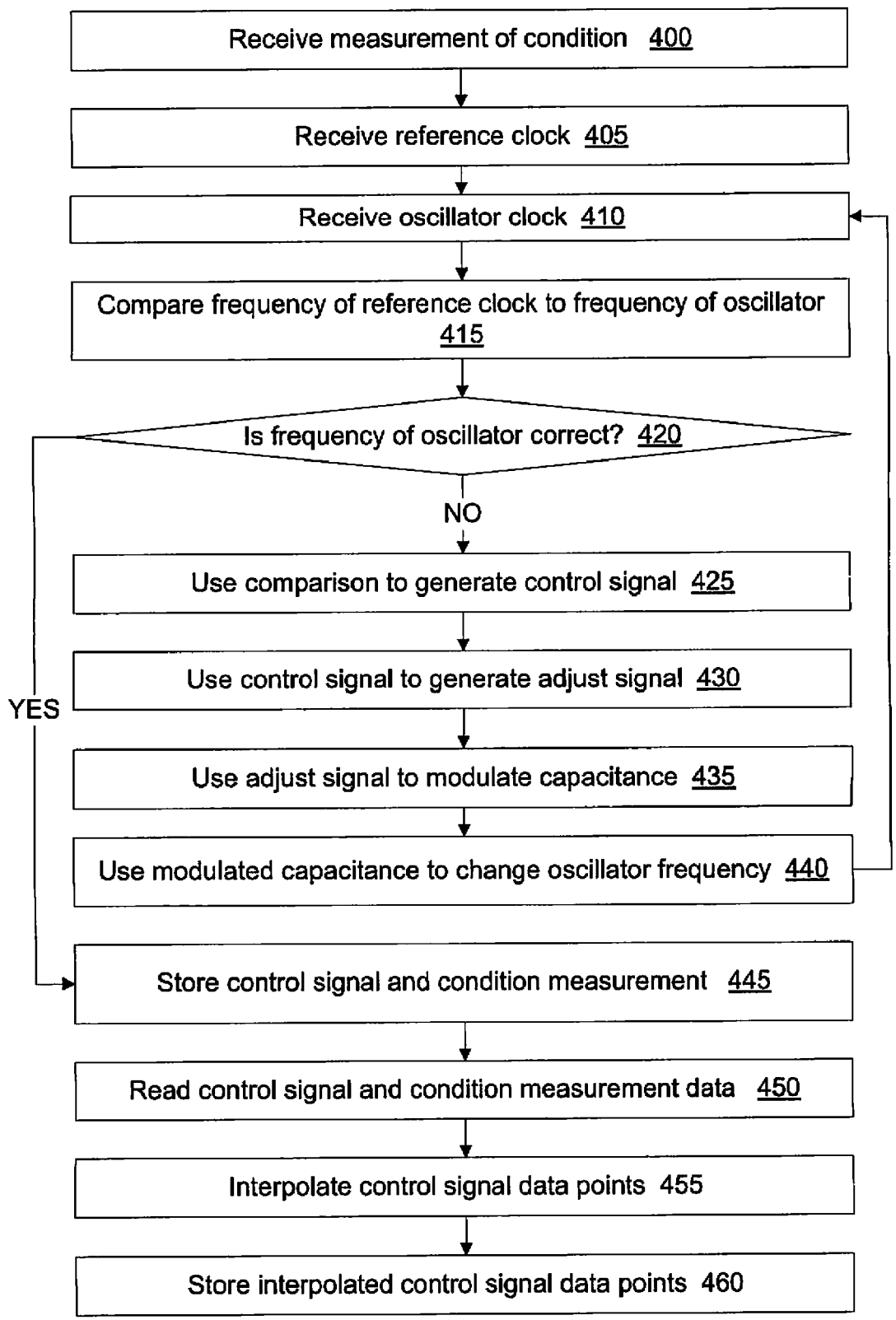
FIG. 4A is a flowchart of a method of calibrating the free-running oscillation circuit of FIG. 2.

FIG. 4A is a flowchart of a method of calibrating the free-running oscillation circuit of FIG. 2. A condition signal corresponding to an environmental, process, or other condition is received in step 400. In step 405, a reference clock signal is received. In step 410, an oscillator clock frequency is received. The frequency of the reference clock is compared to the frequency of the oscillator in step 415.

In step 420, it is determined whether the oscillator is operating at the correct frequency. Specifically, it is determined whether the frequency of the oscillator clock signal is within a margin of error of the frequency of the reference clock signal. If it is, the control signal value, or information corresponding to the control signal, can be stored with the measured condition value in step 445.

If it is not, the comparison is used to generate a control signal in step 425. The control signal is used to generate an adjust signal having a variable duty cycle in step 430. In step 435, the adjust signal is used to pulse-width modulate or vary a capacitance. The modulated capacitance changes the oscillator frequency in step 440. The oscillator clock, with its new frequency, can then be received and compared to the reference clock.

When data is taken at each of the desired temperatures, the condition values and corresponding data can be read in step 450. More data points can be interpolated, for example by use of curve fitting, in step 455. The interpolated control signal values can be stored in step 460.

While this calibration technique is well suited to calibrating a free-running oscillator, it may be used for other circuits as well. One method that is applicable to many other circuits is shown in the following figure.

Figure 4B:
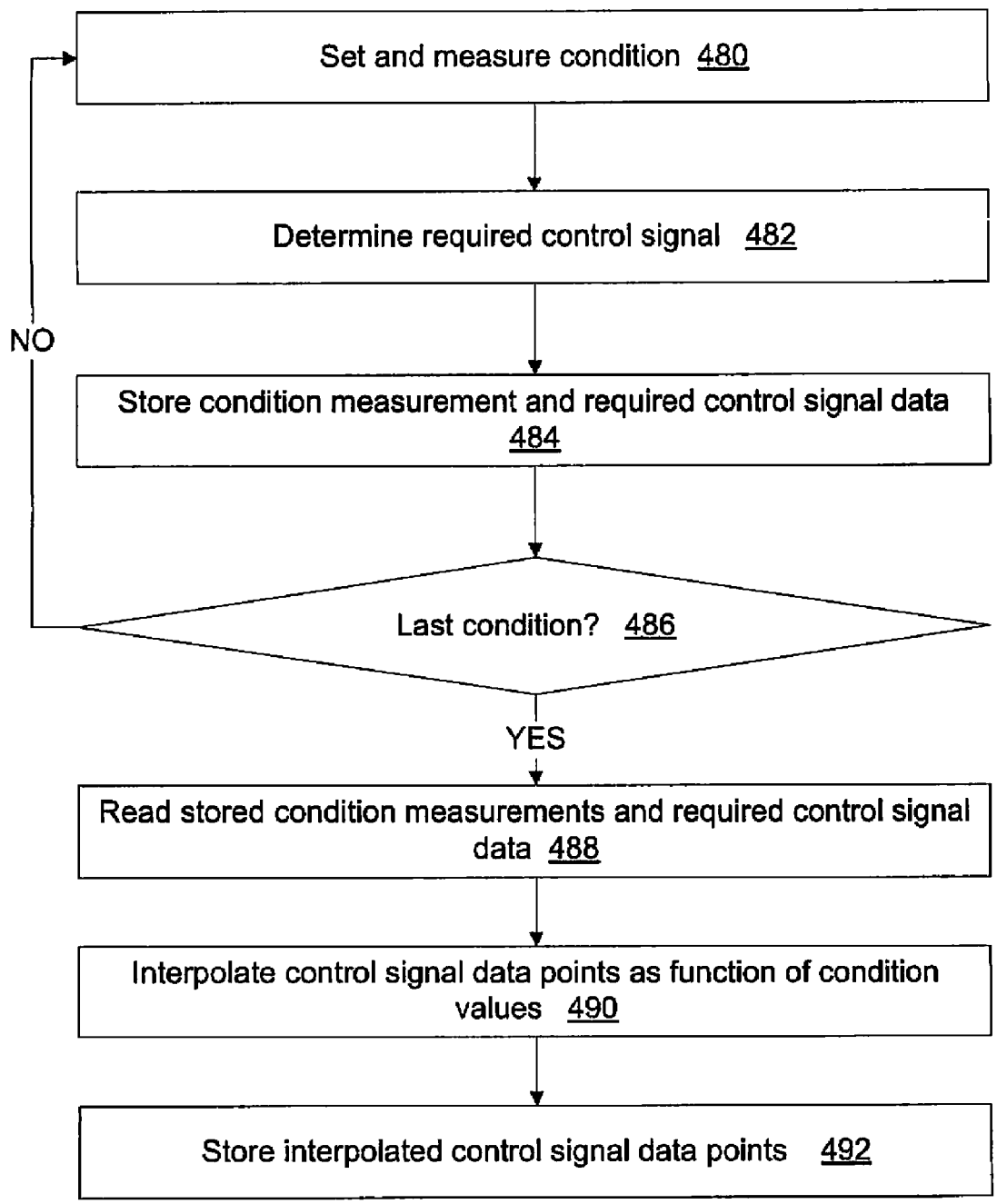
FIG. 4B is a flowchart of a method of calibrating a circuit according to an embodiment of the present disclosure.

FIG. 4B is a flowchart of a method of calibrating a circuit according to an embodiment of the present invention. In step 480, a condition is set and measured. For example, a temperature may be set using a heating circuit as described above. In step 482, a control signal that is required to achieve a desired outcome at the set condition is determined. In step 484, the condition measurement and required control signal data is stored. This data may be stored in an on-chip, or off-chip memory, FIFO, lookup table, registers, or other storage locations. Alternately, the data may be processed or further used in real-time without being stored. Alternately, the condition measurement values may be inferred, and the required control signal data stored at locations identified by those inferred values.

In step 486, it is determined whether data has been taken at the last condition. If it hasn't, the condition is set and measured again in step 480. When data has been taken at each desired condition, the stored condition measurements and required control signal data can be read in step 488. In step 490, additional control signal data points can be interpolated. This may be done by fitting the stored data to a curve, or by other method. One or more processors can perform this curve fitting and interpolation, and these processors can be on-chip or off-chip. Alternately, on-chip and off-chip circuits or processors can share the processing workload. In step 492, the interpolated control signal data points are stored. Typically, this data is stored on-chip, though it may be stored off-chip in various embodiments of the present invention. For example, the data may be stored in an on-chip lookup table or other memory, where address locations are identified by values of the condition signal.

Further refinements to the oscillator circuit shown in FIG. 2 may be desirable in some embodiments of the present invention. For example, a hysteresis buffer can be used to clean up the oscillator output signal. Also, various frequency dividers may be used such that a desired clock frequency is realized. Examples are described in the following two figures.

Figure 5:
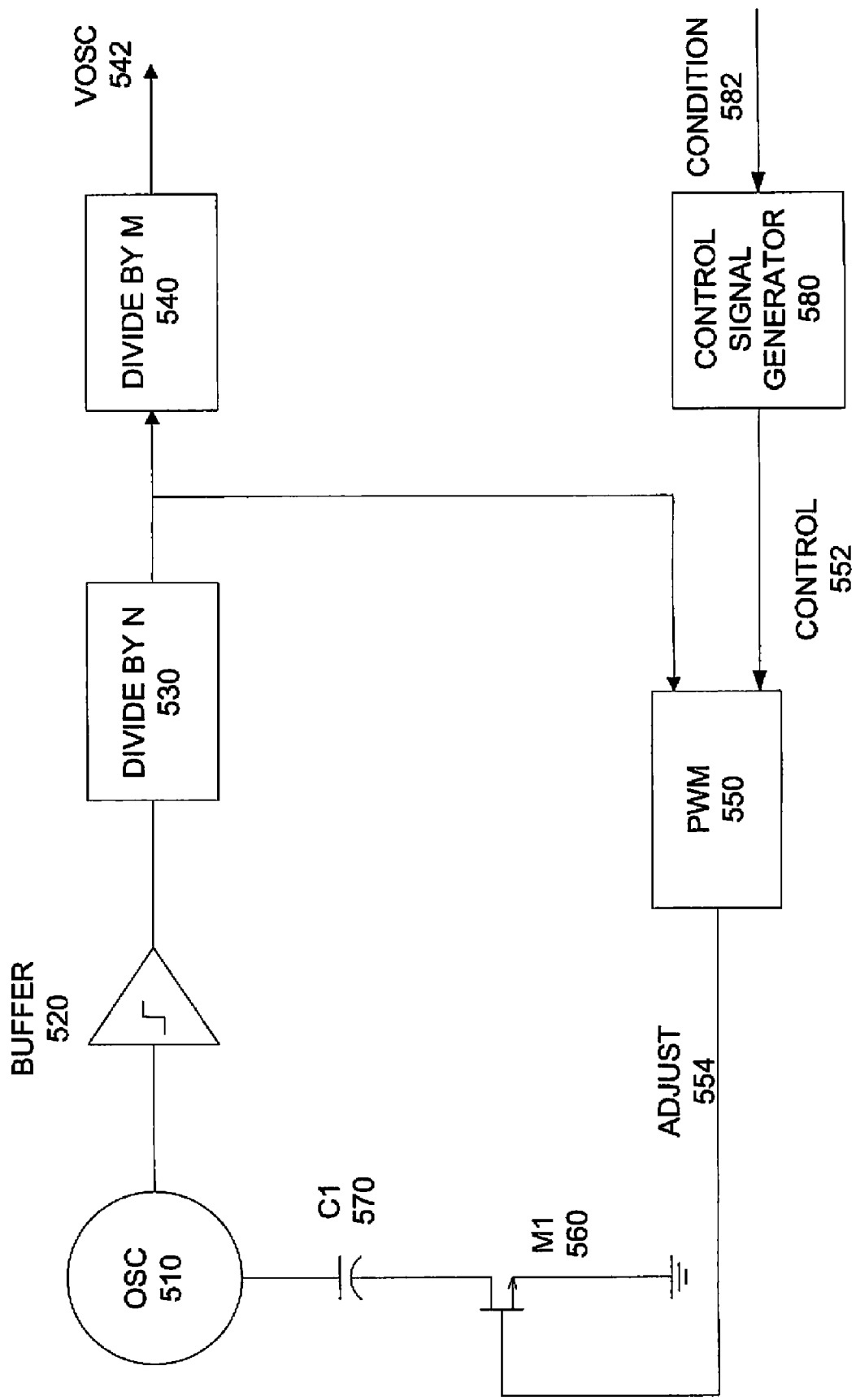
FIG. 5 is a more detailed block diagram of a free-running oscillation circuit according to an embodiment of the present disclosure.

FIG. 5 is a more detailed block diagram of a free-running oscillation circuit according to an embodiment of the present invention. This circuit includes an oscillator 510, buffer 520, dividers 530 and 540, pulse-width modulation circuit 550, transistor M1 560, capacitor C1 570, and control signal generator 580. The effective capacitance of the capacitor C1 570 at least partially determines a frequency response or characteristic of the oscillator 510, for examples its oscillation frequency. While only one capacitor C1 570 and corresponding transistor M1 560 is shown for simplicity, typical embodiments of the present invention included several such combinations in series or parallel controlled by various adjust signals.

The oscillator 510 provides an output oscillation signal to the buffer 520. The buffer 520 gains and sharpens the edges of the output signal provided by the oscillator 510, which is typically a low-amplitude sinusoid. The buffer 520 may also include hysteresis to provide a substantially glitch free output.

The output of the buffer 520 is received by a divider circuit 530, which divides the frequency provided by the oscillator by a factor of "N." This signal can further be divided by divider 540, which in this example divides the frequency by a factor of "M" to provide a signal Vosc on line 542. In other embodiments, other frequency dividers and multipliers may be used. These dividers may also be programmable.

The control signal generator circuit 580 receives a condition signal on line 582. Again, this signal may be derived by the measurement of an environmental, process, or other type of parameter. The control signal generator circuit 580 provides a control signal on line 552 to the pulse-width modulator circuit 550. The pulse width modulator circuit 550 provides an adjust signal on line 554 to the oscillator circuit. This signal has a duty cycle that is modulated as a function of the condition signal received on line 552.

The adjust signal on line 554 controls the impedance of transistor M1 560, which connects and disconnects capacitor C1 570 from the oscillator 510. Changes in the duty cycle of the adjust signal on line 554 varies the effective capacitance of capacitor C1 570 seen by the oscillator 510. This in turn varies its oscillation frequency, and thus the frequency of the output signal Vosc on line 542.

Figure 6:
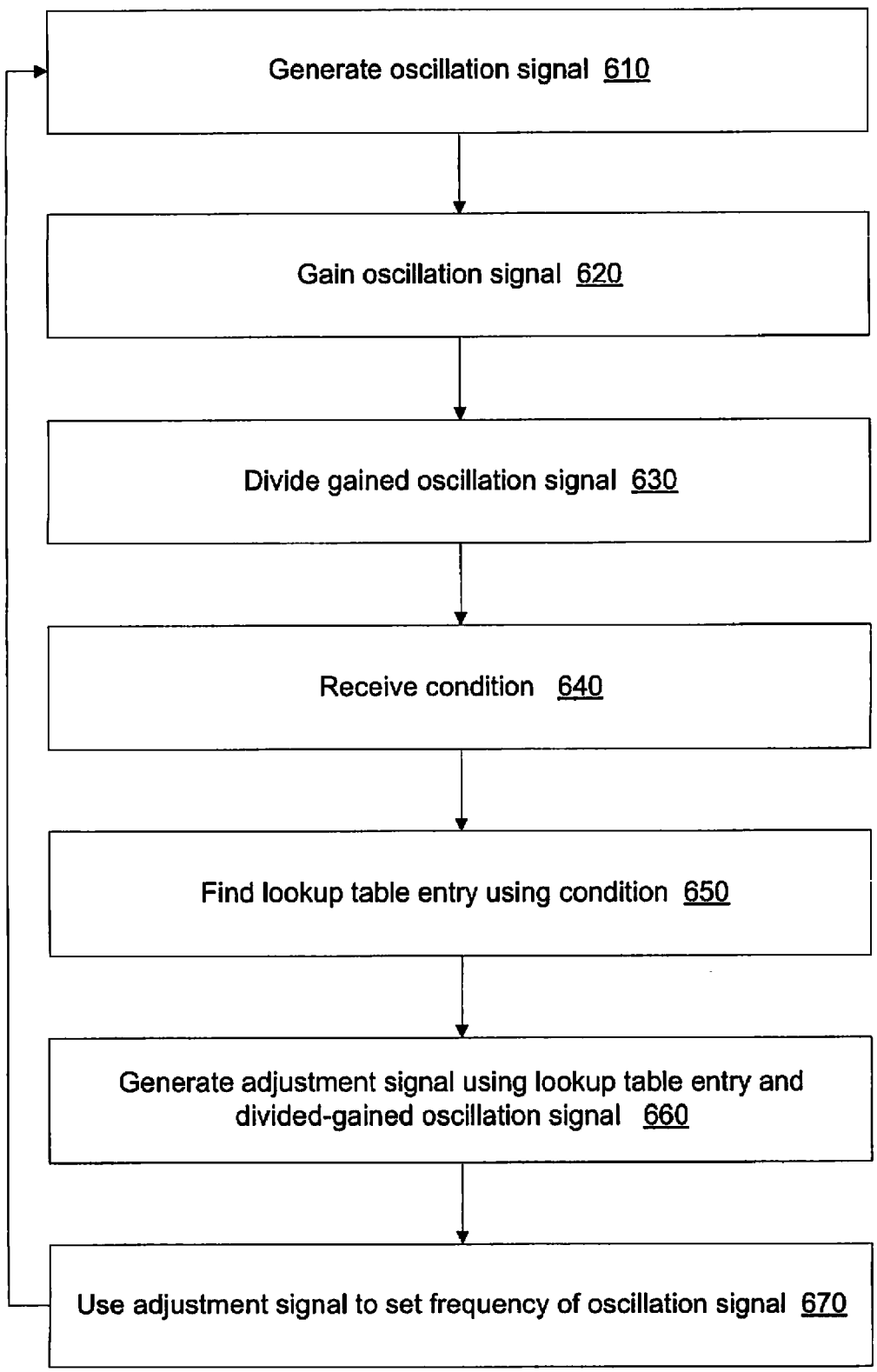
FIG. 6 is a flowchart illustrating the operation of the free-running oscillation circuit of FIG. 5.

FIG. 6 is a flowchart illustrating the operation of the free-running oscillation circuit of FIG. 5. An oscillation signal is generated in step 610. In step 620, this oscillation signal is gained. This has the effect of sharpening the edges and increasing the amplitude of the oscillation signal. In step 630, the frequency of the oscillation signal is divided. In step 640, a measurement of a condition is received. As before, the condition may be an environmental, process, or other type of condition. The measurement received may be a voltage or current that is related to the condition. For example, a voltage proportional to absolute temperature may be received.

In step 650, a lookup table entry is found using the measurement of the condition. In step 660, an adjustment signal is generated using the lookup table entry and the divided-gained oscillation signal. The adjustment signal is used to set the frequency of the oscillation signal in active 670.

The entries in the lookup table may be such that the resulting oscillation frequency remains constant over temperature. Alternately, they may be such that the resulting oscillation frequency has some relationship to temperature. In other embodiments, other conditions besides temperature may be used in finding entries in the lookup table. Further, more than one condition may be used by various embodiments of the present invention. In other embodiments, other memories or storage circuits can be used instead of a lookup table.

Figure 7:
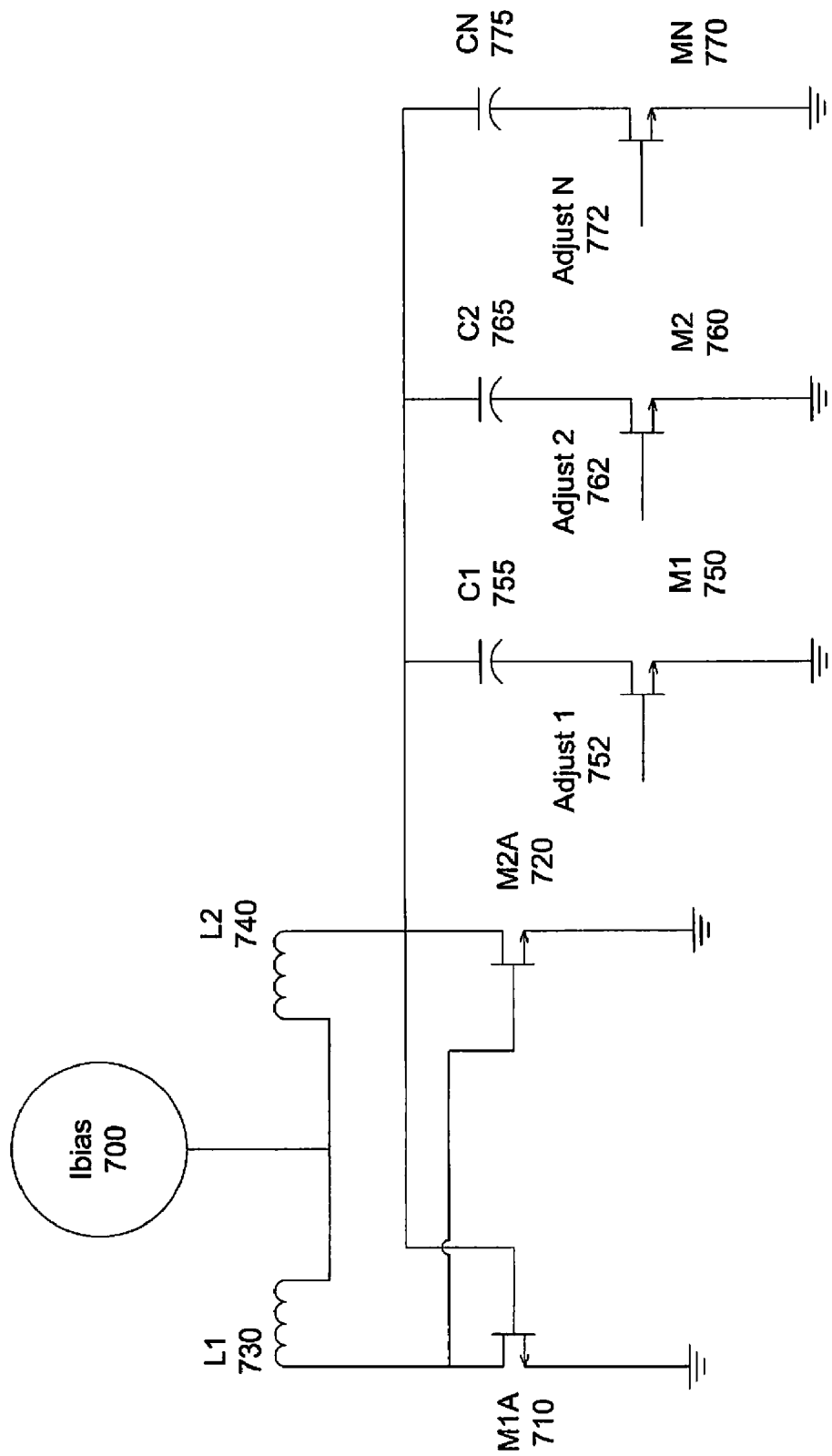
FIG. 7 is a schematic of an oscillator that may be used as the oscillator 510 in the free-running oscillation circuit of FIG. 5 or as an oscillator in other embodiments of the present disclosure.

FIG. 7 is a schematic of an oscillator that may be used as the oscillator 510 in the free-running oscillation circuit of FIG. 5, or as an oscillator in other embodiments of the present invention. This figure includes a bias current generator 700, an oscillator core (or tank) including transistors M1A 710 and M2A 720, load (or tank) inductors L1 730 and L2 740, and pulse-width modulated capacitors C1 755, C2 765, and CN 775, as well as their corresponding transistors M1 750, M2 760, and MN 770. Only the pulse-width modulated capacitors connected to the drain of M2A 720 are shown: corresponding capacitors and transistors connected to the drain of transistor M1 710 are omitted for clarity. The gates of the omitted corresponding transistors can be driven by the same signals as transistors M1 750, M2 750, and MN 770, though they may be driven by other signals. Other capacitors that are not selectively coupled and decoupled from the oscillator core are also typically connected to the drains of M1A 710 and M2A 720. These capacitors have been omitted for clarity.

The frequency of oscillation of this circuit is determined by the values of the inductors and the effective capacitance values seen by those inductors. These capacitors may be connected or disconnected by their corresponding transistors on a steady-state basis, or they may be switched by a signal having a duty cycle under control of a pulse with modulation circuit.

In one embodiment of the present invention, there are 16 capacitors and corresponding transistors connected to the drain of M2A 720, and 16 other capacitors connected to the drain of M1A 710. These transistors can be equally weighted, and they can be switched under control of 4 bits that are thermally decoded into 16 adjust signals. The signals can have a duty cycle that is varied in increments of one thirty-second of the period of the adjust signals. In other embodiments, other numbers of capacitors may be used, and their values may be weighted in a different manner. For example, they may be binarily weighted, and four, eight, or thirty-two capacitors may be used. Further, the duty cycle may be varied in equal or unequal increments, and the number of increments may be more or less than 32. For example, the duty cycle may be varied in eighths, sixteenths, or sixty-fourths of the adjust signal period. Alternately, non-binary numbers may be used for any of these parameters.

In one exemplary embodiment of the present invention, a maximum frequency for the oscillation circuit is achieved when all capacitors remain disconnected by their corresponding transistors. The frequency of oscillation can be reduced by one quantum by applying an adjust signal having a minimum duty cycle to one transistor (or typically, one transistor connected to a capacitor that is connected to the drain of M1A 710 and one transistor connected to a capacitor that is connected to the drain of M2A 720). The frequency of oscillation can further be reduced by increasing this duty cycle, until the transistor remains on, that is, until its adjust signal has a duty cycle of one.

Further decreases in oscillator frequency are achieved by applying an adjust signal having a minimum duty cycle to a second transistor while the first transistor remains fully on and the remaining transistors remain off. Decreases in oscillator frequency can continue until all transistors remained fully on, at which point a minimum oscillation frequency is reached. The operation of one exemplary pulse-width modulator that provides signals such as these is shown in the next two figures.

Figure 8:
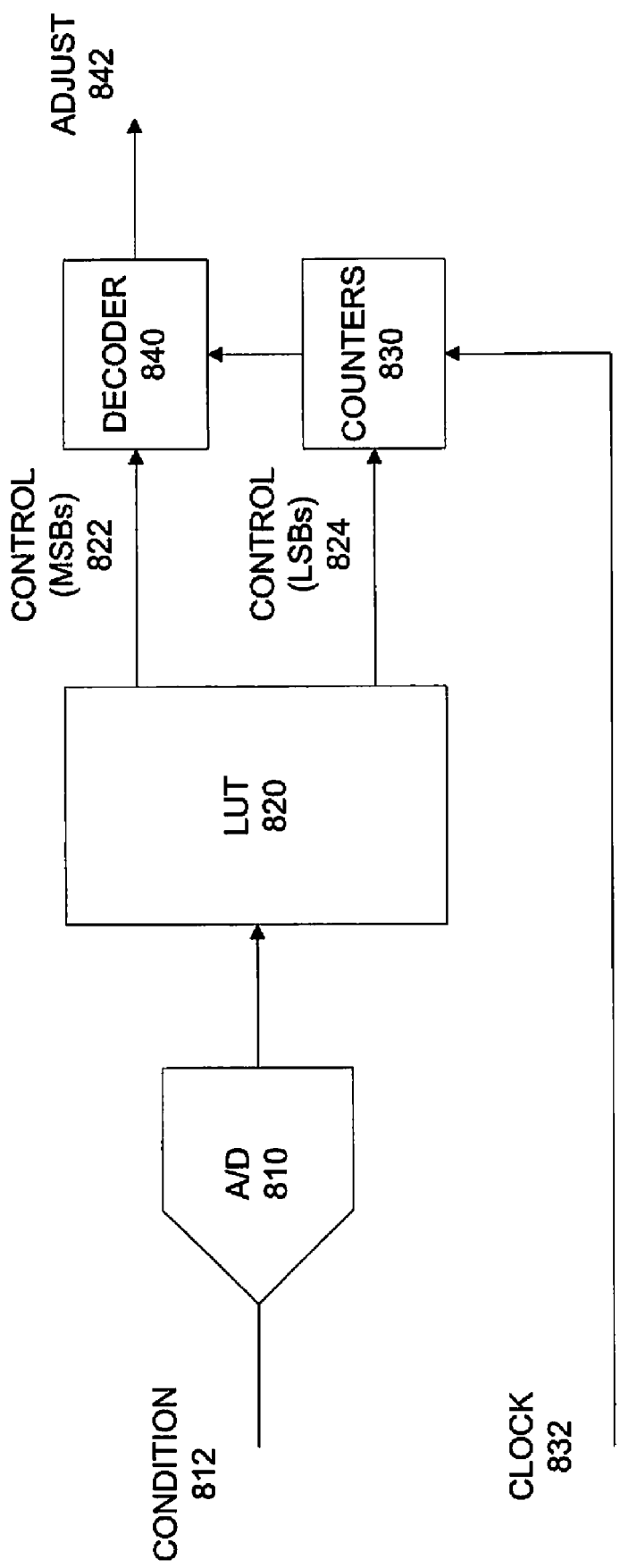
FIG. 8 illustrates a control signal generator and pulse-width modulator that may be used as the control signal generator and pulse-width modulator of FIG. 5 or as a control signal generator and pulse-width modulator in other embodiments of the present disclosure.

FIG. 8 is a control signal generator and pulse-width modulator that may be used as the control signal generator and pulse-width modulator of FIG. 5 or as a control signal generator and pulse-width modulator in other embodiments of the present invention. This figure includes a control signal generator made up of an analog-to-digital converter 810 and lookup table 820, and a pulse-width modulator made up of a counter 830 and decoder 840. In other embodiments of the present invention, other circuits can be used to implement the control signal generator and pulse-width modulator.

A condition signal is received on line 812 by the analog-to-digital converter 810. The analog-to-digital converter provides a digital word that is used to address the lookup table 820. The lookup table in turn provides a control signal to the counter 830 and decoder 840.

The control signal MSBs provided by the lookup table 820 on line 822 to the decoder 840 are decoded and provided as a number of adjust signals on lines 842. In one embodiment of the present invention, a thermometer decoder is used. A thermometer decoder decodes binarily weighted bits into a number of equally weighted bits. The control signal LSBs on line 824 provided to the counter 830 are used to control the duty cycle of at least one of the adjust signals on lines 842, as is shown in the timing diagram which follows.

Figure 9:
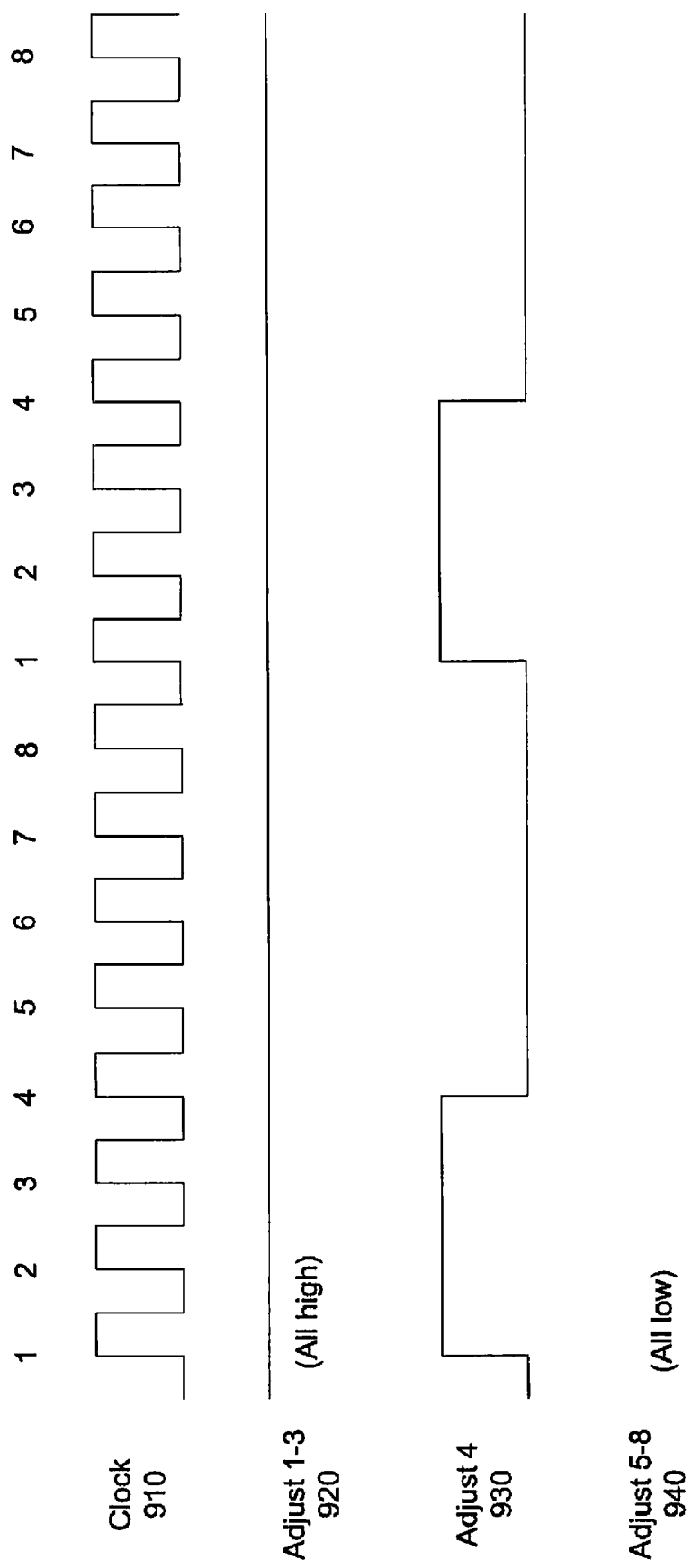
FIG. 9 is a timing diagram illustrating the operation of the pulse-width modulator of FIG. 8.

FIG. 9 is a timing diagram illustrating the operation of the pulse-width modulator of FIG. 8. This figure includes a clock signal 910, adjust 1-3 signals 920, adjust 4 signal 930, and adjust 5-8 signals 940. The state of these signals represents one of 64 possible states for this exemplary embodiment of the present invention.

In this example, the adjust 1-3 signals 920 remain high, while adjust 5-8 signals 940 remain low. The adjust 4 signal 930 has a variable signal that has a duty cycle of three-eighths. That is, it is high for three cycles of the clock 910, and low for 5 clock cycles. In this embodiment, the eight adjust signals are decoded from three bits provided by lookup table, while the duty cycle is controlled by another three bits provided by lookup table. In a specific embodiment of the present invention, four bits are provided to the decoder for 16 adjust signals, and five bits are provided to the counter, for 32 possible duty cycles. In this embodiment, there are 512 possible signal states, that is, the capacitance of the tank circuit can be varied in 512 increments.

In this example, the effective capacitance can be reduced one quantum by changing the duty cycle to one-fourth, or increased one quantum by changing the duty cycle to one-half. In other embodiments, the period may be less than or more than 8 clock cycles, and more or less than eight adjust signals may be generated.

The capacitance seen by the oscillator when the adjust 4 signal 930 is high is greater than when the adjust 4 signal 930 is low. Accordingly, the oscillator tries to alternately decrease and increase its frequency. This would cause frequency modulation of the clock. However, if the clock is divided by the same ratio or integer multiple thereof as the pulse width modulated frequency then the frequency modulation is substantially cancelled.

Figure 10B:
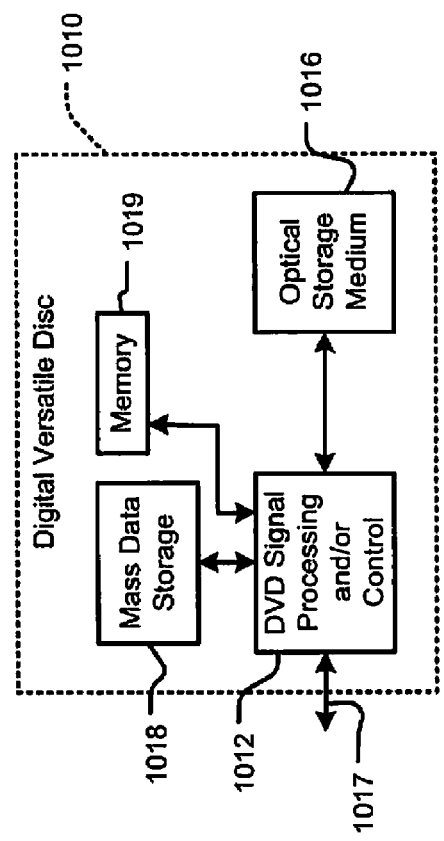
FIG. 10B is a functional block diagram of a DVD drive.
Figure 10A:
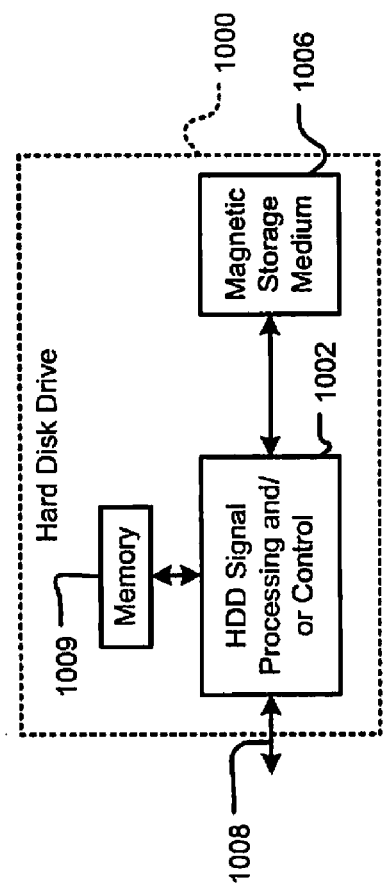
FIG. 10A is a functional block diagram of a hard disk drive.

Referring now to FIGS. 10A-10G, various exemplary implementations of the present invention are shown. Referring to FIG. 10A, the present invention may be embodied in a hard disk drive 1000. The present invention may implement either or both signal processing and/or control circuits, which are generally identified in FIG. 10A at 1002. In some implementations, signal processing and/or control circuit 1002 and/or other circuits (not shown) in HDD 1000 may process data, perform coding and/or encryption, perform calculations, and/or format data that is output to and/or received from a magnetic storage medium 1006.

HDD 1000 may communicate with a host device (not shown) such as a computer, mobile computing devices such as personal digital assistants, cellular phones, media or MP3 players and the like, and/or other devices via one or more wired or wireless communication links 1008. HDD 1000 may be connected to memory 1009, such as random access memory (RAM), a low latency nonvolatile memory such as flash memory, read only memory (ROM) and/or other suitable electronic data storage.

Referring now to FIG. 10B, the present invention may be embodied in a digital versatile disc (DVD) drive 1010. The present invention may implement either or both signal processing and/or control circuits, which are generally identified in FIG. 10B at 1012, and/or mass data storage 1018 of DVD drive 1010. Signal processing and/or control circuit 1012 and/or other circuits (not shown) in DVD 1010 may process data, perform coding and/or encryption, perform calculations, and/or format data that is read from and/or data written to an optical storage medium 1016. In some implementations, signal processing and/or control circuit 1012 and/or other circuits (not shown) in DVD 1010 can also perform other functions such as encoding and/or decoding and/or any other signal processing functions associated with a DVD drive.

DVD drive 1010 may communicate with an output device (not shown) such as a computer, television or other device via one or more wired or wireless communication links 1017. DVD 1010 may communicate with mass data storage 1018 that stores data in a nonvolatile manner. Mass data storage 1018 may include a hard disk drive (HDD) such as that shown in FIG. 10A. The HDD may be a mini HDD that includes one or more platters having a diameter that is smaller than approximately 1.8". DVD 1010 may be connected to memory 1019, such as RAM, ROM, low latency nonvolatile memory such as flash memory, and/or other suitable electronic data storage.

Figure 10D:
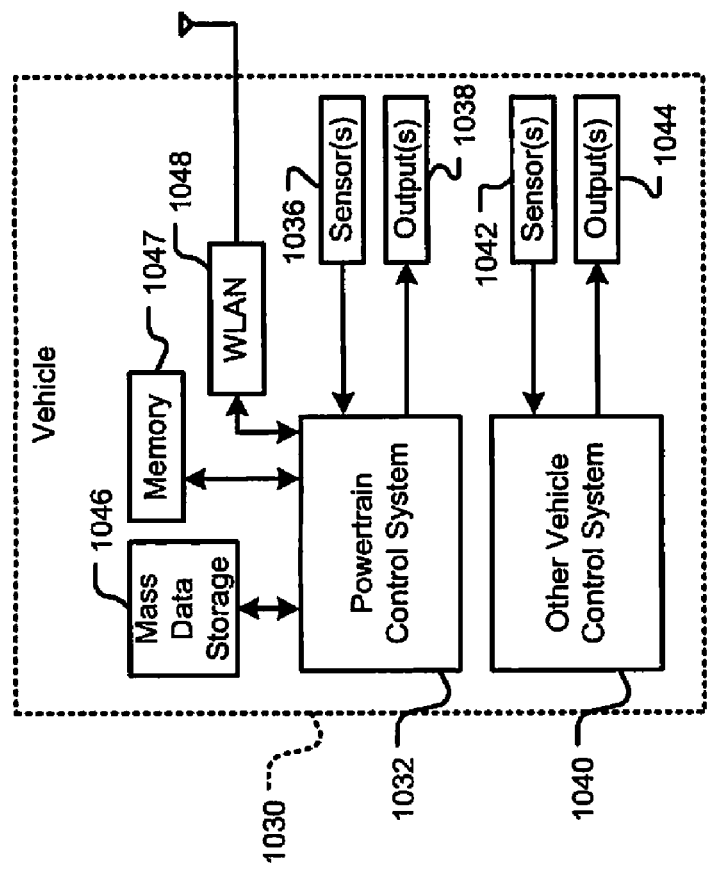
FIG. 10D is a functional block diagram of a vehicle control system.
Figure 10C:
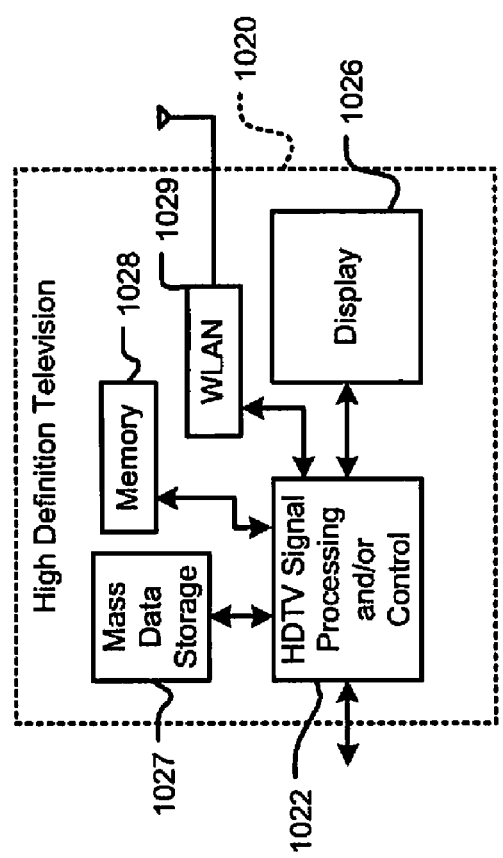
FIG. 10C is a functional block diagram of a high definition television.

Referring now to FIG. 10C, the present invention may be embodied in a high definition television (HDTV) 1020. The present invention may implement either or both signal processing and/or control circuits, which are generally identified in FIG. 10C at 1022, a WLAN interface and/or mass data storage of the HDTV 1020. HDTV 1020 receives HDTV input signals in either a wired or wireless format and generates HDTV output signals for a display 1026. In some implementations, signal processing circuit and/or control circuit 1022 and/or other circuits (not shown) of HDTV 1020 may process data, perform coding and/or encryption, perform calculations, format data and/or perform any other type of HDTV processing that may be required.

HDTV 1020 may communicate with mass data storage 1027 that stores data in a nonvolatile manner such as optical and/or magnetic storage devices. At least one HDD may have the configuration shown in FIG. 10A and/or at least one DVD may have the configuration shown in FIG. 10B. The HDD may be a mini HDD that includes one or more platters having a diameter that is smaller than approximately 1.8". HDTV 1020 may be connected to memory 1028 such as RAM, ROM, low latency nonvolatile memory such as flash memory and/or other suitable electronic data storage. HDTV 1020 also may support connections with a WLAN via a WLAN network interface 1029.

Referring now to FIG. 10D, the present invention implements a control system of a vehicle 1030, a WLAN interface and/or mass data storage of the vehicle control system. In some implementations, the present invention implements a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 1040 of vehicle 1030. Control system 1040 may likewise receive signals from input sensors 1042 and/or output control signals to one or more output devices 1044. In some implementations, control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1032 may communicate with mass data storage 1046 that stores data in a nonvolatile manner. Mass data storage 1046 may include optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". Powertrain control system 1032 may be connected to memory 1047 such as RAM, ROM, low latency nonvolatile memory such as flash memory and/or other suitable electronic data storage. Powertrain control system 1032 also may support connections with a WLAN via a WLAN network interface 1048. The control system 1040 may also include mass data storage, memory and/or a WLAN interface (all not shown).

Figure 10E:
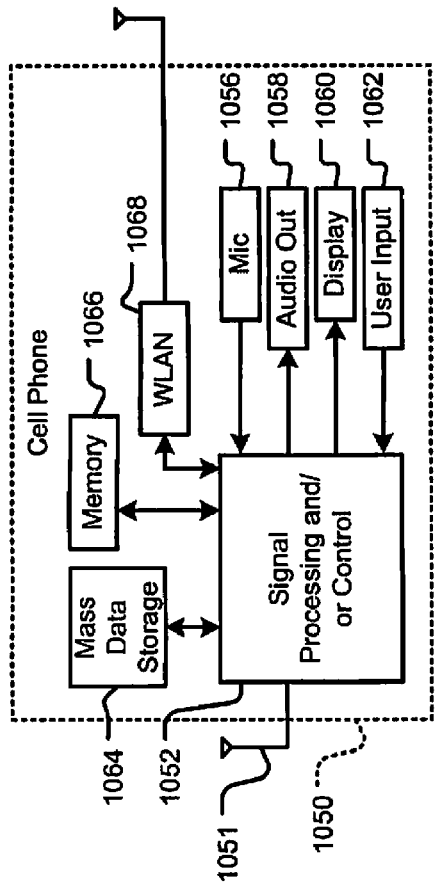
FIG. 10E is a functional block diagram of a cellular phone.

Referring now to FIG. 10E, the present invention may be embodied in a cellular phone 1050 that may include a cellular antenna 1051. The present invention may implement either or both signal processing and/or control circuits, which are generally identified in FIG. 10E at 1052, a WLAN interface and/or mass data storage of the cellular phone 1050. In some implementations, cellular phone 1050 includes a microphone 1056, an audio output 1058 such as a speaker and/or audio output jack, a display 1060 and/or an input device 1062 such as a keypad, pointing device, voice actuation and/or other input device. Signal processing and/or control circuits 1052 and/or other circuits (not shown) in cellular phone 1050 may process data, perform coding and/or encryption, perform calculations, format data and/or perform other cellular phone functions.

Cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". Cellular phone 1050 may be connected to memory 1066 such as RAM, ROM, low latency nonvolatile memory such as flash memory and/or other suitable electronic data storage. Cellular phone 1050 also may support connections with a WLAN via a WLAN network interface 1068.

Figure 10F:
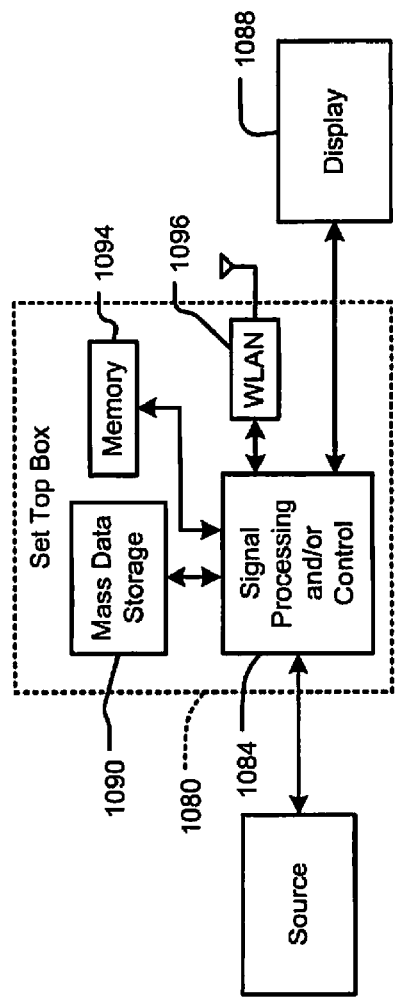
FIG. 10F is a functional block diagram of a set top box.

Referring now to FIG. 10F, the present invention may be embodied in a set top box 1080. The present invention may implement either or both signal processing and/or control circuits, which are generally identified in FIG. 10F at 1084, a WLAN interface and/or mass data storage of the set top box 1080. Set top box 1080 receives signals from a source such as a broadband source and outputs standard and/or high definition audio/video signals suitable for a display 1088 such as a television and/or monitor and/or other video and/or audio output devices. Signal processing and/or control circuits 1084 and/or other circuits (not shown) of the set top box 1080 may process data, perform coding and/or encryption, perform calculations, format data and/or perform any other set top box function.

Set top box 1080 may communicate with mass data storage 1090 that stores data in a nonvolatile manner. Mass data storage 1090 may include optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". Set top box 1080 may be connected to memory 1094 such as RAM, ROM, low latency nonvolatile memory such as flash memory and/or other suitable electronic data storage. Set top box 1080 also may support connections with a WLAN via a WLAN network interface 1096.

Figure 10G:
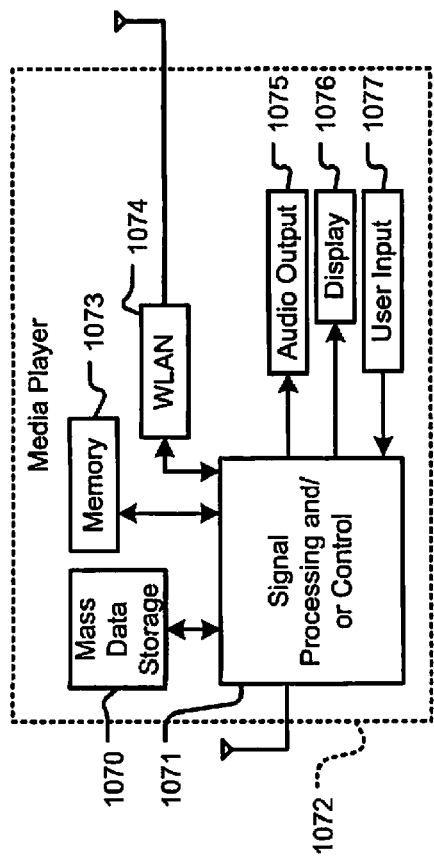
FIG. 10G is a functional block diagram of a media player.

Referring now to FIG. 10G, the present invention may be embodied in a media player 1072. The present invention may implement either or both signal processing and/or control circuits, which are generally identified in FIG. 10G at 1071, a WLAN interface and/or mass data storage of the media player 1072. In some implementations, media player 1072 includes a display 1076 and/or a user input 1077 such as a keypad, touchpad and the like. In some implementations, media player 1072 may employ a graphical user interface (GUI) that typically employs menus, drop down menus, icons and/or a point-and-click interface via display 1076 and/or user input 1077. Media player 1072 further includes an audio output 1075 such as a speaker and/or audio output jack. Signal processing and/or control circuits 1071 and/or other circuits (not shown) of media player 1072 may process data, perform coding and/or encryption, perform calculations, format data and/or perform any other media player function.

Media player 1072 may communicate with mass data storage 1070 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". Media player 1072 may be connected to memory 1073 such as RAM, ROM, low latency nonvolatile memory such as flash memory and/or other suitable electronic data storage. Media player 1072 also may support connections with a WLAN via a WLAN network interface 1074.

Figure 10H:
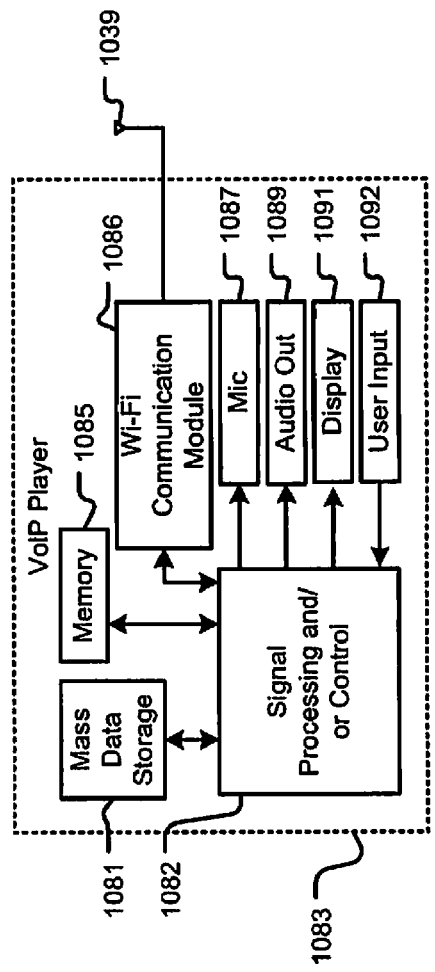
FIG. 10H is a functional block diagram of a VoIP player.

Referring to FIG. 10H, the present invention may be embodied in a Voice over Internet Protocol (VoIP) phone 1083 that may include an antenna 1039. The present invention may implement either or both signal processing and/or control circuits, which are generally identified in FIG. 10H at 1082, a wireless interface and/or mass data storage of the VoIP phone 1083. In some implementations, VoIP phone 1083 includes, in part, a microphone 1087, an audio output 1089 such as a speaker and/or audio output jack, a display monitor 1091, an input device 1092 such as a keypad, pointing device, voice actuation and/or other input devices, and a Wireless Fidelity (Wi-Fi) communication module 1086. Signal processing and/or control circuits 1082 and/or other circuits (not shown) in VoIP phone 1083 may process data, perform coding and/or encryption, perform calculations, format data and/or perform other VoIP phone functions.

VoIP phone 1083 may communicate with mass data storage 502 that stores data in a nonvolatile manner such as optical and/or magnetic storage devices, for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". VoIP phone 1083 may be connected to memory 1085, which may be a RAM, ROM, low latency nonvolatile memory such as flash memory and/or other suitable electronic data storage. VoIP phone 1083 is configured to establish communications link with a VoIP network (not shown) via Wi-Fi communication module 1086. Still other implementations in addition to those described above are contemplated.

Figure 11:
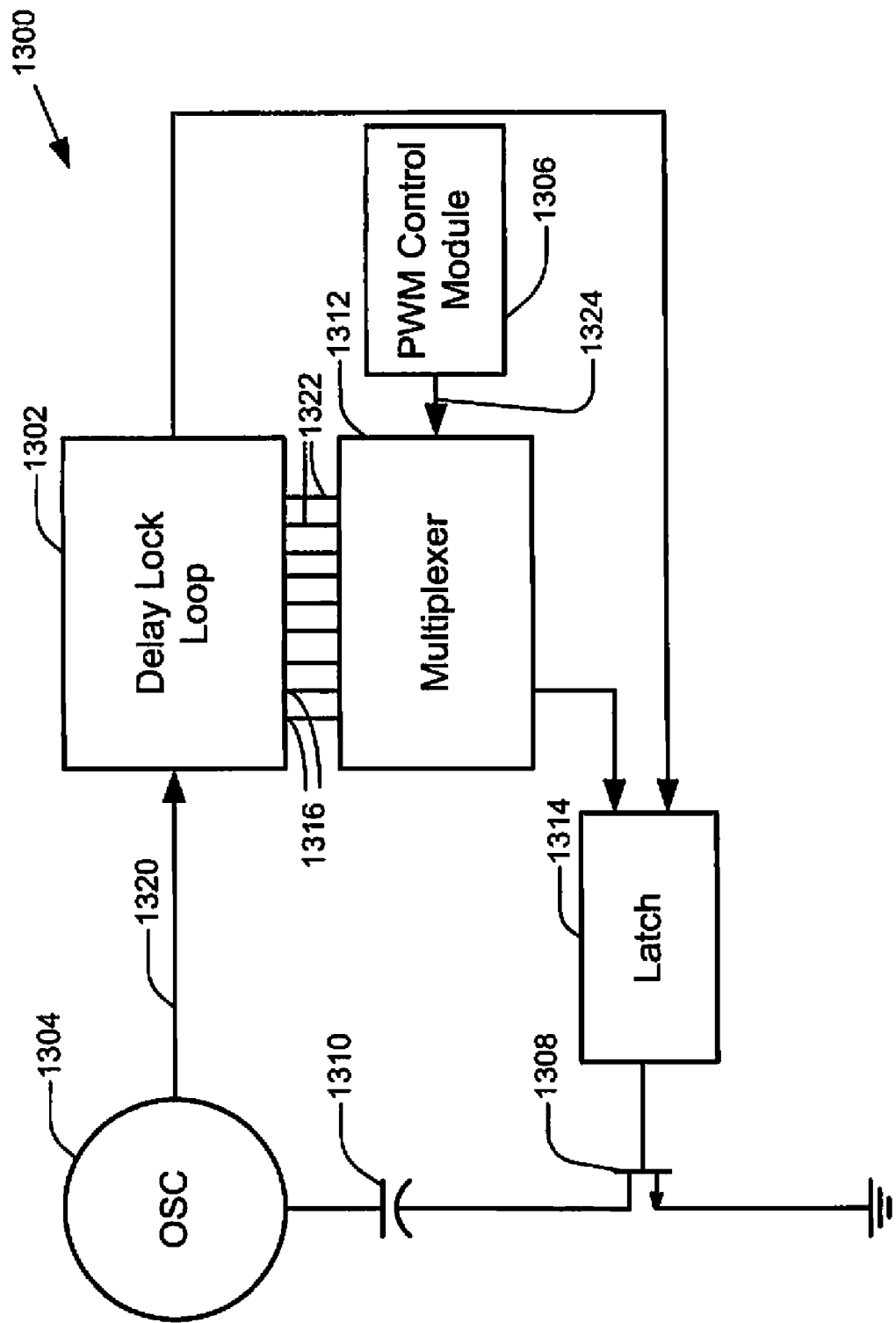
FIG. 11 is a block diagram of a free-running oscillation circuit incorporating a delay lock loop (DLL) circuit according to an embodiment of the present disclosure.

Referring to FIG. 11, a block diagram of a free-running oscillation circuit 1300 incorporating a DLL circuit 1302 is shown. The free-running oscillation circuit 1300 is similar to the free-running oscillation circuit of FIG. 3 in that it includes an oscillator 1304, a pulse-width modulation (PWM) control module 1306, and a tunable circuit including a transistor 1308 and a capacitor 1310. The free-running oscillation circuit 1300 also includes the DLL circuit 1302, as well as a multiplexer 1312 and a latch 1314. Note that the transistor 1308 may be part of or replaced with a switch or a switching circuit.

The DLL circuit 1302 increases circuit clock signal resolution and is in communication with the oscillator 1304 and the multiplexer 1312. The DLL circuit 1302 is coupled to the multiplexer 1312 via delay line tap terminals 1316. The latch 1314 is in communication with the DLL circuit 1302 and the multiplexer 1312. The latch 1314 controls the variable state of the transistor 1308 based on signals received from the DLL circuit 1302 and the multiplexer 1312. The latch 1314 may be a SR latch as shown or may be some other suitable latch or latching module.

The DLL circuit 1302 increases resolution and thus allows for fine tuning of a received clock signal 1320 from the oscillator 1304. The DLL circuit 1302 provides small incremental delay line signals 1322 that are based on the clock signal 1320 thereby allowing fractional pulses to be used to control the tunable circuit. The incremental delay line signals 1322 may be referred to as taps $TAPS_{1-X}$, where X is an integer that represents the total number of taps. The clock signal 1320 has an associated PWM period T for a given signal pulse. The multiplexer 1312 selects one of the taps $TAP_S$ for the given modulated period T, where S is an integer value greater than zero (0) and less than or equal to X. Each tap has a corresponding initial pulse HIGH and/or ON state with a width τ.

The tap selection is based on a PWM control signal 1324 generated by the PWM control module 1306. The resolution of the free-running oscillation circuit 1300 is based on the pulse width τ divided by the modulated period T (τ/T). When the tap $TAP_X$ is selected, the free-running oscillation circuit 1300 is operating in a full ON state.

Figure 12:
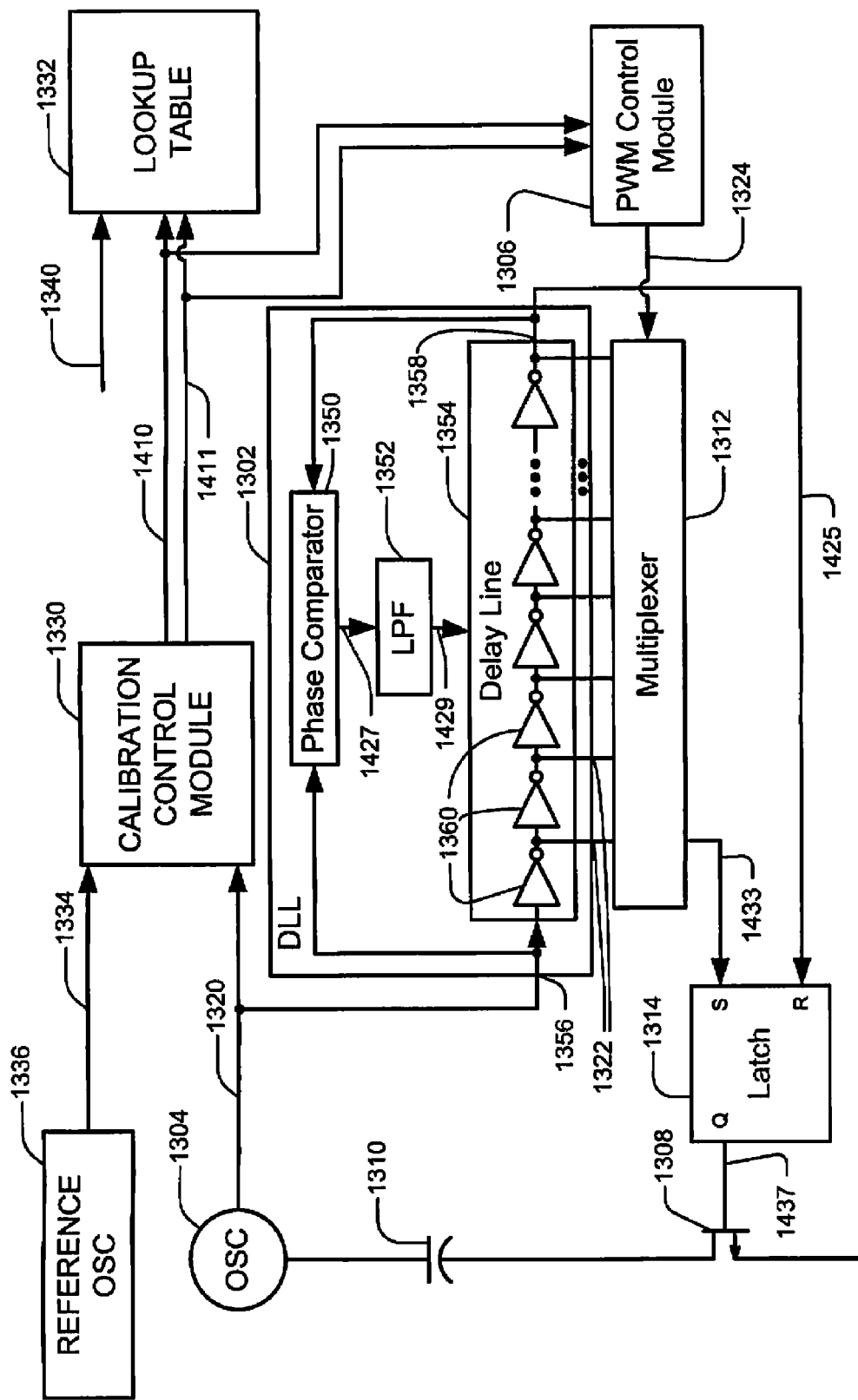
FIG. 12 is a block diagram illustrating the free-running oscillation circuit of FIG. 11 undergoing calibration.

Referring to FIG. 12, a block diagram illustrating the free-running oscillation circuit 1300 undergoing calibration is shown. A calibration control module 1330 is coupled between the oscillator 1304 and the PWM control module 1306. The oscillator 1304 is referred to as a primary oscillator for the described embodiment. Likewise, the clock signal 1320 is referred to as a primary clock signal 1320. A lookup table 1332 is in communication with the calibration control module 1330. In use, the primary oscillator 1304 generates the primary clock signal 1320, which is received along with a reference clock signal 1334 by the calibration control module 1330. The reference clock signal 1334 is generated by a reference oscillator 1336. The calibration control module 1330 generates calibration control signals 1410, 1411 that are received by the PWM control module 1306 and may also be received by the lookup table 1332. Although the calibration control signals 1410, 1411 are shown as separate signals, they may be provided via the same signal line. As similarly described above, the lookup table 1332 may receive a condition signal 1340.

The DLL circuit 1302 includes a phase comparator 1350, a low pass filter 1352 and a delay line 1354, as well as a DLL circuit input 1356 and output 1358. The delay line 1354 delays the primary clock signal 1320 and has cascaded delay buffers 1360, which are coupled in series. The DLL circuit input 1356 is coupled to the primary oscillator 1304. The DLL circuit input 1356 is coupled to the phase comparator 1350 and the delay line 1354. The phase comparator 1350 compares phases of the primary clock signal 1320 and output of the delay line 1354. The phase comparator 1350 is coupled to the low pass filter 1352, which is in turn coupled to the delay line 1354. The DLL circuit output 1358 is coupled to the phase comparator 1350. Delay line tap terminals 1304 associated with each delay buffer 1360 are coupled to the multiplexer 1312.

Figure 13:
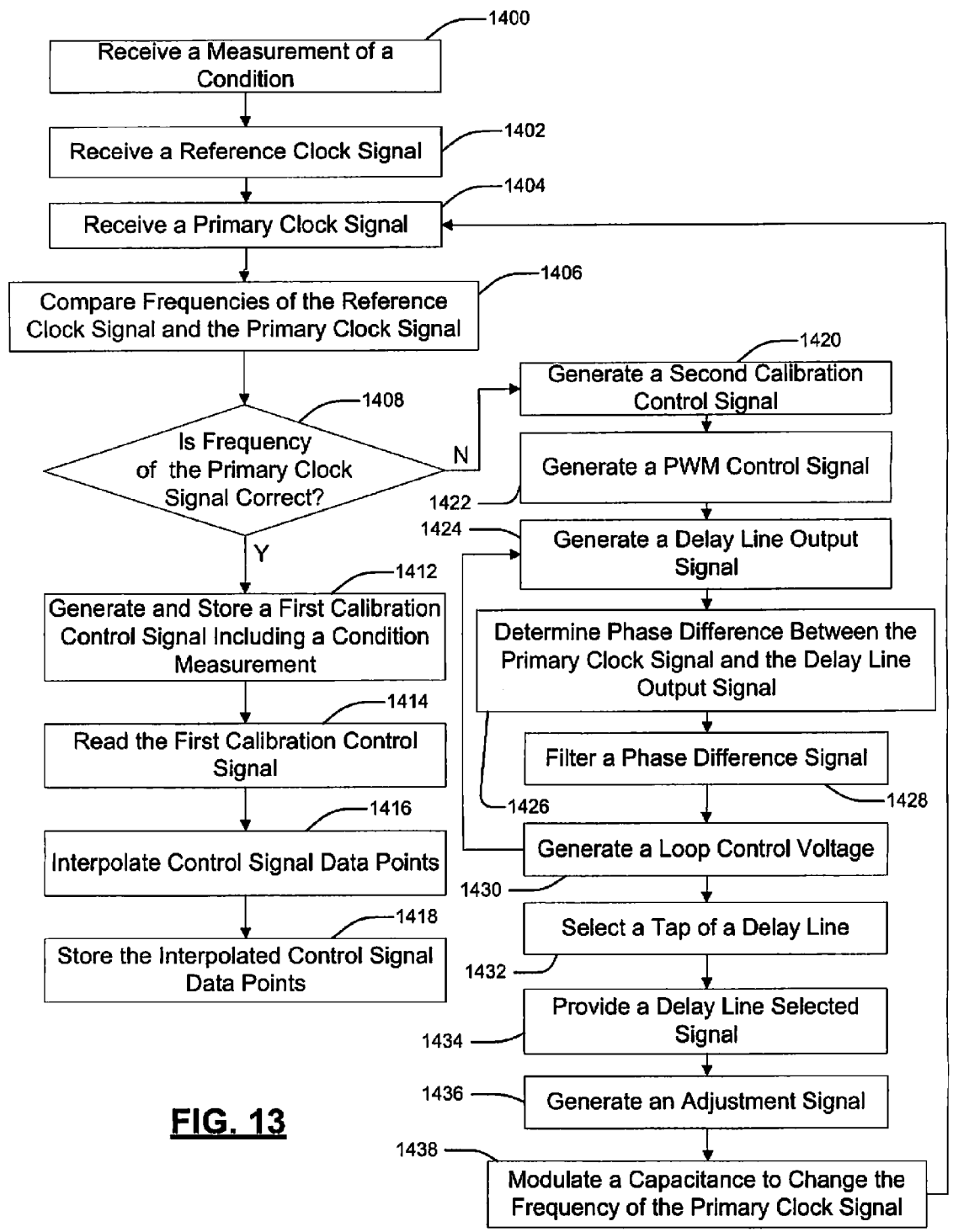
FIG. 13 is a flowchart illustrating a method of calibrating the free-running oscillation circuit of FIG. 12 according to another embodiment of the present disclosure.

Referring now also to FIG. 13, a flowchart illustrating a method of calibrating a free-running oscillation circuit is shown. The condition signal, 1340 corresponds to an environment, process, or other condition and is received in step 1400. In step 1402, the reference clock signal 1334 is received by the calibration control module 1330 from the reference oscillator 1336. In step 1404, the primary clock signal 1320 is also received by the calibration control module 1330 from the primary oscillator 1304.

A reference frequency of the reference clock signal 1334 is compared to a primary frequency of the primary clock signal 1320 in step 1406. In step 1408, the calibration control module 1330 determines whether the primary oscillator 1304 is operating at a correct frequency. Specifically, the calibration control module 1330 determines whether the primary frequency is within a margin of error of the reference frequency.

When the primary frequency is within the margin of error, the first calibration control signal 1410 is generated by the calibration control module 1330 based on the determination in step 1412. The first calibration control signal 1410 is stored with the measured condition value in the lookup table 1332. This process may be repeated for several condition values or states, and for one or more different conditions.

When data is taken at different temperatures, the first calibration control signal 1410 and the condition values and corresponding data can be read in step 1414. More data points can be interpolated, for example by use of curve fitting, in step 1416. The interpolated control signal values can be stored in step 1418. While this calibration technique is well suited to calibrate a free-running oscillator, it may be used for other circuits as well.

In step 1420, when the primary frequency is not within the margin of error, the calibration control module 1330 generates the second calibration control signal 1411 based on the determination. In step 1422, the PWM 1306 generates the PWM control signal 1324 based on the second control signal 1411.

In step 1424, the delay line 1354 generates a delay line output signal 1425 based on the primary clock signal 1320. The primary clock signal 1320 is passed through the buffers 1360 to generate the delay line output signal 1425. In step 1426, the primary clock signal 1320 is compared with the generated delay line output signal 1425. The DLL circuit 1302 determines the phase difference between the primary clock signal 1320 and the delay line output signal 1425 and generates a phase difference signal 1427. In step 1428, the phase difference signal 1427 is filtered to generate a filtered phase difference signal 1429, which is provided to a delay line 1354. In step 1430, the filtered phase difference signal 1429 is used as a loop control voltage, which is provided to the buffers 1360. Control may return to step 1424 upon completion of step 1430 and iteratively perform steps 1424-1430 to update the loop control voltage.

In step 1432, the PWM control signal 1324 is used to select a tap of the delay line 1354. For example only, the PWM control signal 1324 may be a digital control signal. The multiplexer 1312 selects a tap based on the PWM control signal to provide a selected delay line signal 1433 based on the selected taps in step 1434.

In step 1436, the latch 1314 generates an adjustment signal 1437 based on the delay line combined signal 1433 and the delay line output signal 1425. The capacitor 1310 is modulated to change the primary frequency based on the adjustment signal 1437, in step 1438. The above steps may be repeated with a new primary clock signal. The frequency of the new primary clock signal may be received and compared to a reference clock signal through repetition of the steps 1404-1408 and 1420-1438 and/or performance of the steps 1412-1418.

Figure 14:
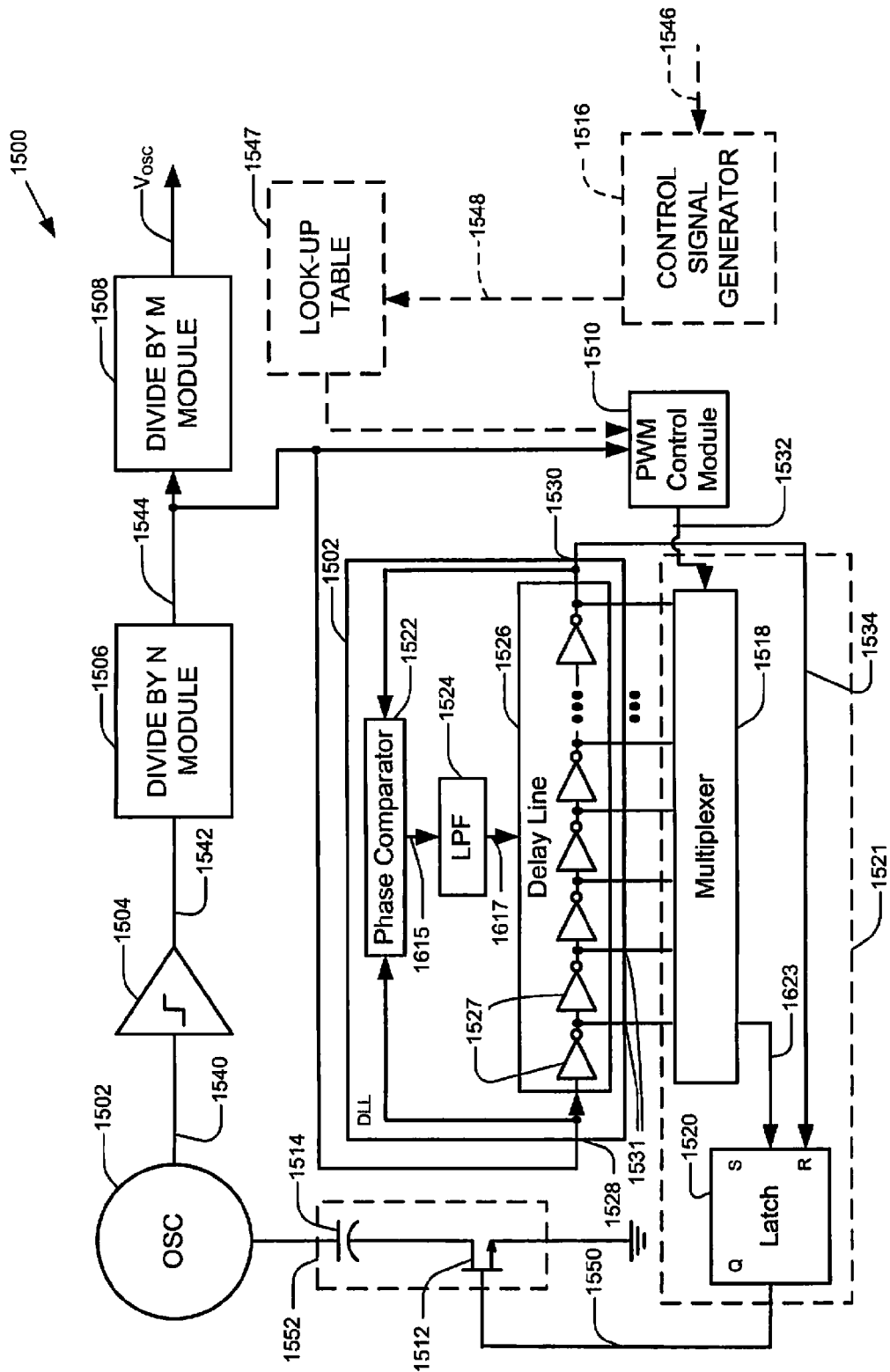
FIG. 14 is a block diagram of a free-running oscillation circuit incorporating a DLL circuit according to another embodiment of the present disclosure.

Referring to FIG. 14, a more detailed block diagram of a free-running oscillation circuit 1500 incorporating a DLL circuit 1502 is shown. The free-running oscillation circuit 1500 is similar to the free-running oscillation circuit of FIG. 5 in that it includes an oscillator 1502, a buffer 1504, a divide by N module 1506, a divide by M module 1508, a PWM control module 1510, a transistor 1512, a capacitor 1514, and a control signal generator 1516. The free-running oscillation circuit 1500 also includes the DLL circuit 1502, as well as a multiplexer 1518 and a latch 1520. The multiplexer 1518 and the latch 1520 are part of a DLL selection circuit 1521.

The DLL circuit 1502 includes a phase comparator 1522, a low pass filter 1524 and a delay line 1526 and has a DLL circuit input 1528 and output 1530. The phase comparator 1522 is coupled to the low pass filter 1524, which is in turn coupled to the delay line 1526, which has cascaded buffers 1527. The DLL circuit input 1528 is coupled to the divide by N and M modules 1506, 1508. The DLL circuit output 1530 is coupled to the latch 1520. The multiplexer 1518 selects one of tap outputs 1531 of the delay line 1526 based on a PWM control signal 1532 from the PWM control module 1510. The latch 1520 may be set and reset based on the selected tap outputs and a delay line output signal 1534 from the delay line output 1530.

The oscillator 1502 provides a primary clock signal 1540 to the buffer 1504. The buffer 1504 adjusts the amplitude and sharpens the edges of the primary clock signal 1540 provided by the oscillator 1502. The buffer 1504 may have a hysteresis characteristic to provide a substantially glitch free output signal.

A buffered oscillation signal 1542 out of the buffer 1504 is received by the divide by N module 1506. The divide by N module 1506 divides the frequency of the buffered oscillation signal 1542 by a factor of N to generate a divided clock signal 1544. The divided clock signal 1544 is reduced in frequency relative to the buffered oscillation signal 1542. The frequency of the divided clock signal 1544 may be further divided by the divide by M module 1508, which in turn generates an output signal $V_{osc}$. In other embodiments, other frequency dividers and multipliers may be used. These dividers may also be programmable.

The control signal generator 1516 receives a condition input signal 1546. The condition input signal 1546 may be derived by the measurement of an environment, process, or other type of parameter. The control signal generator 1516 generates a condition control signal 1548 based on the condition input signal 1546. The condition control signal 1548 may be used as a reference to a lookup table 1547 to obtain a control word for the PWM control module 1510.

The PWM control module 1510 provides the PWM control signal 1532 to the multiplexer 1518. The PWM control signal 1532 may be generated based on the condition input signal 1546. The PWM control module 1510 may access information stored in the lookup table 1547. The PWM control module 1510 may generate the PWM control signal 1532 based on calibration information stored in the lookup table 1547. The calibration information may be stored in the lookup table 1547 during a calibration period and later accessed during operation. For example, calibration information that is stored based on calibration control signals, such as the calibration control signals 1410, 1411 of FIG. 12, may be stored in the lookup table 1547 and used when generating the PWM control signal 1532. The PWM control module 1510 may also or alternatively generate the PWM control signal 1532 based on condition information stored in the lookup table 1547 by the control signal generator 1516.

The latch 1520 generates an adjustment signal 1550 that controls the impedance of transistor 1512, which connects and disconnects capacitor 1514 from the oscillator 1502. Changes in the duty cycle of the adjustment signal 1550 varies the effective capacitance of the capacitor 1514, as seen by the oscillator 1502. This in turn varies the oscillation frequency of the oscillator 1502, and thus the frequency of the output signal $V_{osc}$. For this reason the transistor 1512 and the capacitor 1514 in combination form a variable capacitance circuit 1552 that receives the adjustment signal 1550 as an input signal.

Figure 15:
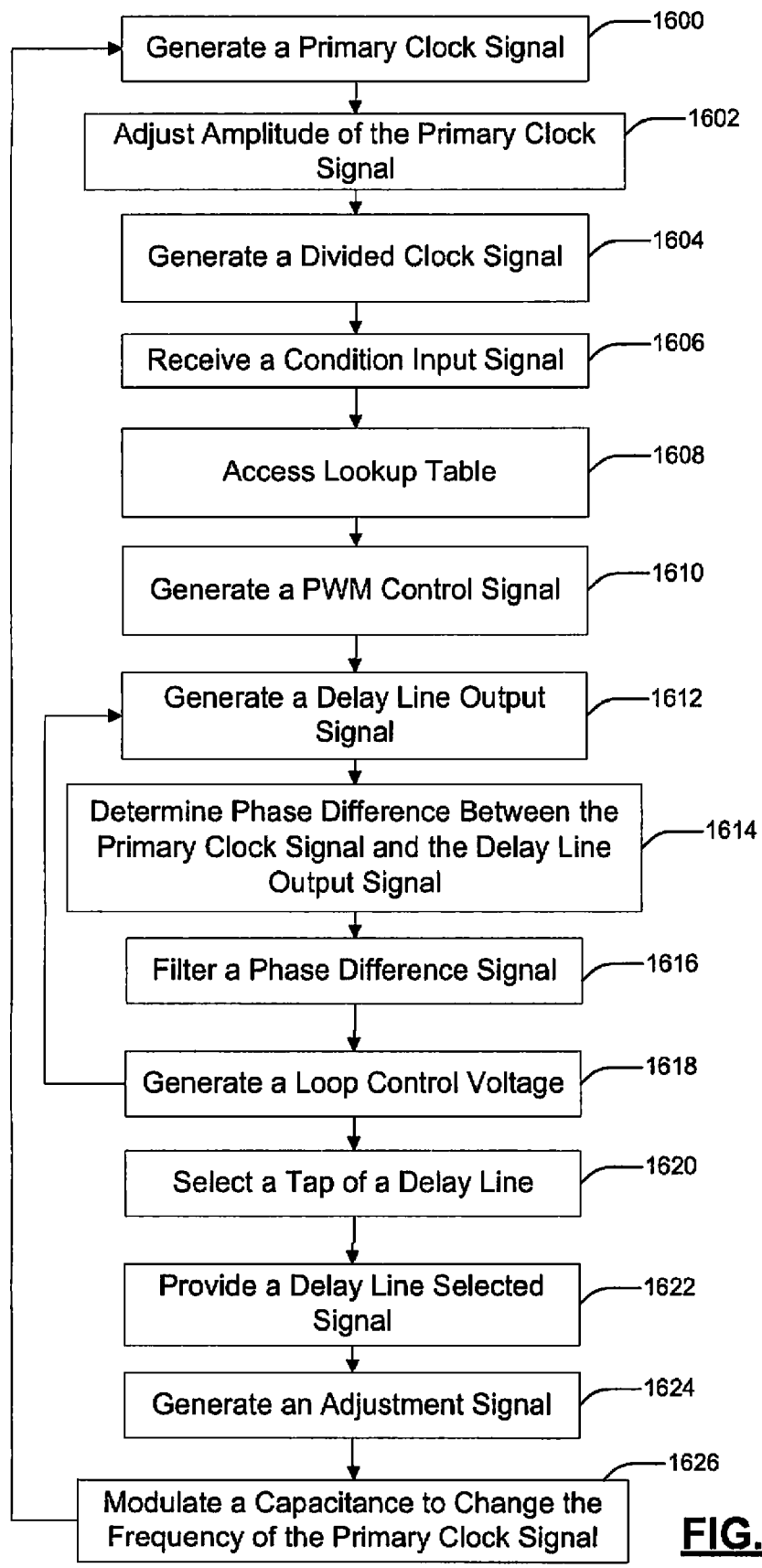
FIG. 15 is a data flow diagram illustrating operation of the free-running oscillation circuit of FIG. 14 according to another embodiment of the present disclosure.

Referring now also to FIG. 15, a data flow diagram illustrating the operation of the free-running oscillation circuit 1500 is shown. The primary clock signal 1540 is generated in step 1600. In step 1602, amplitude of the primary clock signal 1540 is adjusted via the buffer 1504. This has the effect of sharpening the edges and increasing the amplitude of the primary clock signal 1540 to generate the buffered oscillation signal 1542. In step 1604, the frequency of the buffered oscillation signal 1542 is divided to generate the divided clock signal 1544, which is a frequency reduced relative to the buffered oscillation signal 1542. In step 1606, a measurement of a condition may be received and/or stored in the lookup table 1547. For example, the condition input signal 1546 may be received by the control signal generator 1516.

In step 1608, the lookup table 1547 may be accessed to obtain calibration and/or condition information. In step 1610, the PWM control signal 1532 may be generated based on information from the lookup table 1547 and based on the divided clock signal 1544. In step 1612, the delay line output signal 1534 is generated based on the divided clock signal 1544.

In step 1614, the divided clock signal 1544 is compared with the generated delay line output signal 1534. The DLL circuit 1502 determines the phase difference between the divided clock signal 1544 and the delay line output signal 1534 and generates a phase difference signal 1615. In step 1616, the phase difference signal 1615 is filtered to generate a filtered phase difference signal 1617, which is provided to the delay line 1526.

In step 1618, the filtered phase difference signal 1617 is used as a loop control voltage, which is provided to the buffers 1527 of the delay line 1526. Control may return to step 1612 upon completion of step 1618 and iteratively perform steps 1612-1618 to update the loop control voltage.

In step 1620, the PWM control signal 1532 is used to select tap outputs of the delay line 1526, which is based on the frequency reduced clock signal 1544. In step 1622, a delay line combined signal 1623 is generated based on the selected tap outputs.

In step 1624, an adjustment signal, such as the adjustment signal 1550, is generated based on the delay line combined signal 1623 and the delay line output signal 1534. The adjustment signal 1550 is used to set the frequency of the primary clock signal 1540 in step 1626. Control may return to step 1600 upon completion of step 1626 and iteratively perform steps 1600-1626. The steps 1600-1626 may be repeated with a new primary clock signal. The frequency of the new primary clock signal may be received and compared to a reference clock signal.

The above-described steps described with respect to the embodiments of FIGS. 4, 6, 13 and 15 are meant to be illustrative examples; the steps may be performed sequentially, synchronously, simultaneously, or in a different order depending upon the application.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. An integrated circuit comprising:
   a delay lock loop (DLL) circuit configured to generate (i) a plurality of incremental delay line signals and (ii) a delay line output signal, wherein the plurality of incremental delay line signals and the delay line output signal are generated based on a clock signal received from an oscillator;
   a pulse-width modulation (PWM) control module configured to generate a PWM control signal;
   a tunable circuit configured to tune said oscillator based on said delay line output signal, said PWM control signal, and one of said incremental delay line signals;
   a multiplexer configured to select a delay line signal based on said PWM control signal and one of said incremental delay line signals;
   a latch configured to generate an adjustment signal based on said selected delay line signal and said delay line output signal; and
   a switch configured to enable current flow to said tunable circuit based on said adjustment signal.

2. The integrated circuit of claim 1, wherein said tunable circuit comprises:
   a capacitance; and
   said switch is further configured to enable current flow to said capacitance based on said delay line output signal, said PWM control signal, and one of said incremental delay line signals.

3. The integrated circuit of claim 1, wherein said tunable circuit is controlled based on said selected delay line signal and said delay line output signal.

4. The integrated circuit of claim 1, wherein said latch is further configured to enable current flow to said tunable circuit based on said delay line output signal, said PWM control signal, and one of said incremental delay line signals.

5. The integrated circuit of claim 1, wherein said latch is further configured to control charging of said tunable circuit based on said delay line output signal, said PWM control signal, and one of said incremental delay line signals.

6. The integrated circuit of claim 1, wherein said PWM control module generates said PWM control signal based on a condition signal.

7. The integrated circuit of claim 6, wherein said condition signal is generated based on a measurement of at least one of an environment and a process.

8. The integrated circuit of claim 1, wherein:
said DLL circuit comprises a phase detector configured to detect difference in phase between said received clock signal and said delay line output signal; and
said delay line output signal is generated based on said phase difference.

9. The integrated circuit of claim 8, wherein:
said DLL circuit further comprises a filter configured to generate a filtered difference signal based on said phase difference; and
said delay line output signal is generated based on said filtered difference signal.

10. The integrated circuit of claim 1, further comprising a calibration control module configured to generate a calibration control signal based on said received clock signal,
wherein said PWM control module generates said PWM control signal based on said calibration control signal.

11. The integrated circuit of claim 10, wherein said calibration control module generates said calibration control signal based on a reference clock signal.

12. The integrated circuit of claim 10, wherein said calibration control module generates said calibration control signal based on a temperature signal.

13. The integrated circuit of claim 1, further comprising a calibration control module configured to generate a calibration control signal based on a temperature signal,
wherein said PWM control module generates said PWM control signal based on said calibration control signal.

14. The integrated circuit of claim 1, further comprising a divide-by-N module configured to divide said received clock signal to generate a divided clock signal, where N is an integer greater than 0,
wherein said DLL circuit generates said plurality of incremental delay line signals and said delay line output signal based on said divided clock signal.

15. The integrated circuit of claim 1, further comprising a divide-by-N module configured to divide said received clock signal to generate a divided clock signal, where N is an integer greater than 0,
wherein said PWM control module generates said PWM control signal based on said divided clock signal.

16. The integrated circuit of claim 15, wherein said PWM control module generates said PWM control signal based on said divided clock signal and a received condition signal.

17. The integrated circuit of claim 16, wherein said condition signal is generated based on a measurement of at least one of an environment and a process.

18. The integrated circuit of claim 1, wherein said PWM control module generates said PWM control signal based on entries in a lookup table.

19. The integrated circuit of claim 18, wherein said PWM control module generates said PWM control signal based on temperature entries in said lookup table.

20. A method comprising:
based on a clock signal received from an oscillator, generating (i) a plurality of incremental delay line signals and (ii) a delay line output signal;
generating a pulse-width modulation (PWM) control signal;
tuning said oscillator via a tunable circuit and based on said delay line output signal, said PWM control signal, and one of said incremental delay line signals;
selecting a delay line signal via a multiplexer and based on said PWM control signal and one of said incremental delay line signals;
generating an adjustment signal via a latch and based on said selected delay line signal and said delay line output signal; and
enabling current flow to said tunable circuit via a switch and based on said adjustment signal.

21. The method of claim 20, further comprising enabling current flow to a capacitance of said tunable circuit based on said delay line output signal, said PWM control signal, and one of said incremental delay line signals.

22. The method of claim 20, further comprising controlling said tunable circuit based on said selected delay line signal and said delay line output signal.

23. The method of claim 20, further comprising enabling current flow to said tunable circuit based on said delay line output signal, said PWM control signal, and one of said incremental delay line signals.

24. The method of claim 20, further comprising charging said tunable circuit based on said delay line output signal, said PWM control signal, and one of said incremental delay line signals.

25. The method of claim 20, further comprising generating said PWM control signal based on a condition signal.

26. The method of claim 25, wherein said condition signal is generated based on a measurement of at least one of an environment and a process.

27. The method of claim 20, further comprising detecting difference in phase between said received clock signal and said delay line output signal,
wherein said delay line output signal is generated based on said phase difference.

28. The method of claim 27, further comprising generating a filtered difference signal based on said phase difference,
wherein said delay line output signal is generated based on said filtered difference signal.

29. The method of claim 20, further comprising generating a condition signal based on said received clock signal,
wherein said PWM control signal is generated based on said condition signal.

30. The method of claim 29, wherein said condition signal is generated based on a reference clock signal.

31. The method of claim 29, wherein said condition signal is generated based on a temperature signal.

32. The method of claim 20, further comprising generating a condition signal based on a temperature signal,
wherein said PWM control signal is generated based on said condition signal.

33. The method of claim 20, further comprising dividing said received clock signal to generate a divided clock signal via a divide-by-N module, where N is an integer greater than 0,
wherein said plurality of incremental delay line signals and said delay line output signal are generated based on said divided clock signal.

34. The method of claim 20, further comprising dividing said received clock signal to generate a divided clock signal via a divide-by-N module, where N is an integer greater than 0,
wherein said PWM control signal is generated based on said divided clock signal.

35. The method of claim 34, wherein said PWM control signal is generated based on said divided clock signal and a received condition signal.

36. The method of claim 35, wherein said condition signal is generated based on a measurement of at least one of an environment and a process.

37. The method of claim 20, wherein said PWM control signal is generated based on entries in a lookup table.

38. The method of claim 37, wherein said PWM control signal is generated based on temperature entries in said lookup table.

39. An integrated circuit comprising:
a delay lock loop (DLL) circuit configured to generate (i) a plurality of incremental delay line signals and (ii) a delay line output signal, wherein said plurality of incremental delay line signals and said delay line output signal are generated based on a clock signal received from an oscillator;
a pulse-width modulation (PWM) control module configured to generate a PWM control signal;
a tunable circuit configured to tune said oscillator based on said delay line output signal, said PWM control signal, and one of said incremental delay line signals; and
a latch that enables current flow to said tunable circuit based on said delay line output signal, said PWM control signal, and one of said incremental delay line signals.

40. An integrated circuit comprising:
a delay lock loop (DLL) circuit configured to generate (i) a plurality of incremental delay line signals and (ii) a delay line output signal, wherein said plurality of incremental delay line signals and said delay line output signal are generated based on a clock signal received from an oscillator;
a pulse-width modulation (PWM) control module configured to generate a PWM control signal; and
a tunable circuit configured to tune said oscillator based on said delay line output signal, said PWM control signal, and one of said incremental delay line signals,
wherein said PWM control module generates said PWM control signal based on a measurement of at least one of an environment and a process.

* * * * *